US012787868B2

(12) United States Patent
Syu et al.

(10) Patent No.: US 12,787,868 B2
(45) Date of Patent: Nov. 3, 2026

(54) SEMICONDUCTOR PACKAGE ASSEMBLY

(71) Applicant: MEDIATEK INC., Hsinchu City (TW)

(72) Inventors: Shih-Yi Syu, Hsinchu City (TW); Wen-Chou Wu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 898 days.

(21) Appl. No.: 18/145,211

(22) Filed: Dec. 22, 2022

(65) Prior Publication Data

US 2023/0253389 A1 Aug. 10, 2023

Related U.S. Application Data

(60) Provisional application No. 63/319,800, filed on Mar. 15, 2022, provisional application No. 63/307,184, filed on Feb. 7, 2022.

(51) Int. Cl.
*H01L 25/18* (2023.01)
*H01L 23/31* (2006.01)
(Continued)

(52) U.S. Cl.
CPC .......... *H10W 90/00* (2026.01); *H10W 70/611* (2026.01); *H10W 70/65* (2026.01);
(Continued)

(58) Field of Classification Search
CPC . H01L 25/18; H01L 25/0657; H01L 23/3121; H01L 23/49811; H01L 23/5383;
(Continued)

(56) References Cited

U.S. PATENT DOCUMENTS 8,264,091 B2 9/2012 Cho et al.
9,576,821 B2 2/2017 Lo et al.
(Continued)

FOREIGN PATENT DOCUMENTS

TW 201118964 A 6/2011
TW 201405766 A 2/2014
(Continued)

OTHER PUBLICATIONS

Chinese language office action dated Sep. 23, 2023, issued in application No. TW 112104249.

*Primary Examiner* — Peniel M Gumedzoe
(74) *Attorney, Agent, or Firm* — McClure, Qualey & Rodack, LLP

(57) ABSTRACT

A semiconductor package assembly is provided. The semiconductor package assembly includes a fan-out package and a memory package stacked on the fan-out package. The fan-out package includes a first redistribution layer (RDL) structure, a first logic die, through via (TV) interconnects, and first conductive structures. The first logic die and the first conductive structures are in contact with the first RDL structure. The TV interconnects are electrically connected to the first RDL structure. The memory package includes a first substrate, a memory die, and second conductive structures. The memory die and the second conductive structures are disposed on the first substrate. The memory die is electrically connected to the first logic die using the TV interconnects and the first RDL structure. The semiconductor package assembly further includes a second substrate electrically connected to the first logic die using the first conductive structures.

39 Claims, 21 Drawing Sheets

(51) Int. Cl.

| | |
|---|---|
| ***H01L 23/498*** | (2006.01) |
| ***H01L 23/538*** | (2006.01) |
| ***H01L 25/065*** | (2023.01) |
| ***H10W 70/60*** | (2026.01) |
| ***H10W 70/65*** | (2026.01) |
| ***H10W 70/685*** | (2026.01) |
| ***H10W 74/10*** | (2026.01) |
| ***H10W 90/00*** | (2026.01) |
| *H10W 90/24* | (2026.01) |

(52) U.S. Cl.
CPC ........ *H10W 70/685* (2026.01); *H10W 74/114* (2026.01); *H10W 90/401* (2026.01); *H10W 90/701* (2026.01); *H10W 90/24* (2026.01); *H10W 90/722* (2026.01); *H10W 90/754* (2026.01)

(58) Field of Classification Search
CPC ............. H01L 23/5385; H01L 23/5386; H01L 2225/0651; H01L 2225/06562; H01L 2225/1058; H10W 90/00; H10W 90/701; H10W 90/401; H10W 90/754; H10W 90/722; H10W 90/24; H10W 70/685; H10W 70/65; H10W 70/611; H10W 74/114
See application file for complete search history.

(56) References Cited

U.S. PATENT DOCUMENTS

| | | | | |
|---|---|---|---|---|
| 10,483,211 | B2 | 11/2019 | Lin et al. | |
| 11,476,201 | B2 | 10/2022 | Chen et al. | |
| 2012/0248439 | A1* | 10/2012 | Lee | H01L 23/49838 257/777 |
| 2016/0099231 | A1* | 4/2016 | Yang | H01L 23/3171 257/774 |
| 2016/0260693 | A1* | 9/2016 | Lin | H01L 25/16 |
| 2016/0300817 | A1* | 10/2016 | Do | H01L 25/03 |
| 2017/0098628 | A1 | 4/2017 | Liu et al. | |
| 2018/0269188 | A1* | 9/2018 | Yu | H01L 23/3128 |
| 2020/0381405 | A1 | 12/2020 | Patil et al. | |
| 2021/0098380 | A1* | 4/2021 | Chen | H01L 21/565 |

FOREIGN PATENT DOCUMENTS

| | | | |
|---|---|---|---|
| TW | 201714259 | A | 4/2017 |
| TW | 201740521 | A | 11/2017 |
| TW | 202114090 | A | 4/2021 |

* cited by examiner

SEMICONDUCTOR PACKAGE ASSEMBLY

CROSS REFERENCE TO RELATED APPLICATIONS

This application claims the benefit of U.S. Provisional Application No. 63/307,184, filed Feb. 7, 2022 and U.S. Provisional Application No. 63/319,800, filed Mar. 15, 2022, the entirety of which is incorporated by reference herein.

BACKGROUND OF THE INVENTION

Field of the Invention

The present invention relates to a semiconductor package assembly, and, in particular, to a semiconductor package assembly having improved routing density and heat dissipation capability.

Description of the Related Art

Package-on-package (PoP) assembly is an integrated circuit packaging method to combine vertically discrete system-on-chip (SOC) and memory packages. Two or more packages are installed atop each other, i.e., stacked, with a standard interface to route signals between them. This allows higher component density in devices, such as mobile phones, personal digital assistants (PDA), and digital cameras.

Improved thermal dissipation, fine-pitch, and/or fine-size routings and package height shrinkage are important in improving electrical performance in high-end smartphone applications.

Thus, a novel semiconductor package assembly is desirable.

BRIEF SUMMARY OF THE INVENTION

An embodiment of the present invention provides a semiconductor package assembly. The semiconductor package assembly includes a fan-out package and a memory package stacked on the fan-out package. The fan-out package includes a first redistribution layer (RDL) structure, a first logic die, through via (TV) interconnects and first conductive structures. The first redistribution layer (RDL) structure has a top surface and a bottom surface. The first logic die has first pads thereon. The first pads are in contact with the top surface of the first RDL structure. The through via (TV) interconnects surrounds the first logic die and electrically connected to the first RDL structure. The first conductive structures are in contact with the bottom surface of the first RDL structure. The memory package includes a first substrate, a memory die and second conductive structures. The first substrate has a top surface and a bottom surface. The memory die is mounted on the top surface of the first substrate. The second conductive structures are disposed on the bottom surface of the first substrate. The memory die is electrically connected to the first logic die using the second conductive structures, the TV interconnects and the first RDL structure. The semiconductor package assembly further includes a second substrate provided for the fan-out package stack thereon, wherein the second substrate is electrically connected to the first logic die using the first conductive structures.

An embodiment of the present invention provides a semiconductor package assembly. The semiconductor package assembly includes a fan-out package and a memory package stacked on the fan-out package. The fan-out package includes a first redistribution layer (RDL) structure, a first logic die, through via (TV) interconnects and first conductive structures. The first redistribution layer (RDL) structure has a top surface and a bottom surface. The first logic die has first pads close to the top surface of the first RDL structure and electrically connected to the first RDL structure. The through via (TV) interconnects surrounds the first logic die and electrically connected to the first logic die using the first RDL structure, wherein the through via interconnects are arranged by a first pitch. The first conductive structures are disposed on the bottom surface of the first RDL structure. The memory package includes a first substrate, a memory die and second conductive structures. The first substrate has a top surface and a bottom surface. The memory die is mounted on the top surface of the first substrate. The second conductive structures are disposed on the bottom surface of the first substrate and arranged by a second pitch. The-second pitch is shorter than or equal to the first pitch. The semiconductor package assembly further includes a second substrate stack on the fan-out package and opposite the memory package. The second substrate is electrically connected to the memory package using the first logic die.

In addition, an embodiment of the present invention provides a semiconductor package assembly. The semiconductor package assembly includes a fan-out package and a memory package stacked on the fan-out package. The fan-out package includes a first redistribution layer (RDL) structure, a first logic die, through via (TV) interconnects and first conductive structures. The first redistribution layer (RDL) structure has a top surface and a bottom surface. The first logic die has first pads close to the top surface of the first RDL structure and electrically connected to the first RDL structure. The through via (TV) interconnects surrounds the first logic die and electrically connected to the first logic die using the first RDL structure. The first conductive structures are disposed on the bottom surface of the first RDL structure. The memory package includes a first substrate, a memory die and second conductive structures. The first substrate has a top surface and a bottom surface. The memory die is mounted on the top surface of the first substrate. The second conductive structures are disposed on the bottom surface of the first substrate. The memory die is electrically connected to the first logic die using the first RDL structure. The semiconductor package assembly further includes a second substrate stack on the fan-out package and opposite the memory package, wherein the second substrate is electrically connected to the memory package using the fan-out package. A first lateral dimension of the fan-out package is less than or equal to a second dimension of the second substrate in a cross-sectional view.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
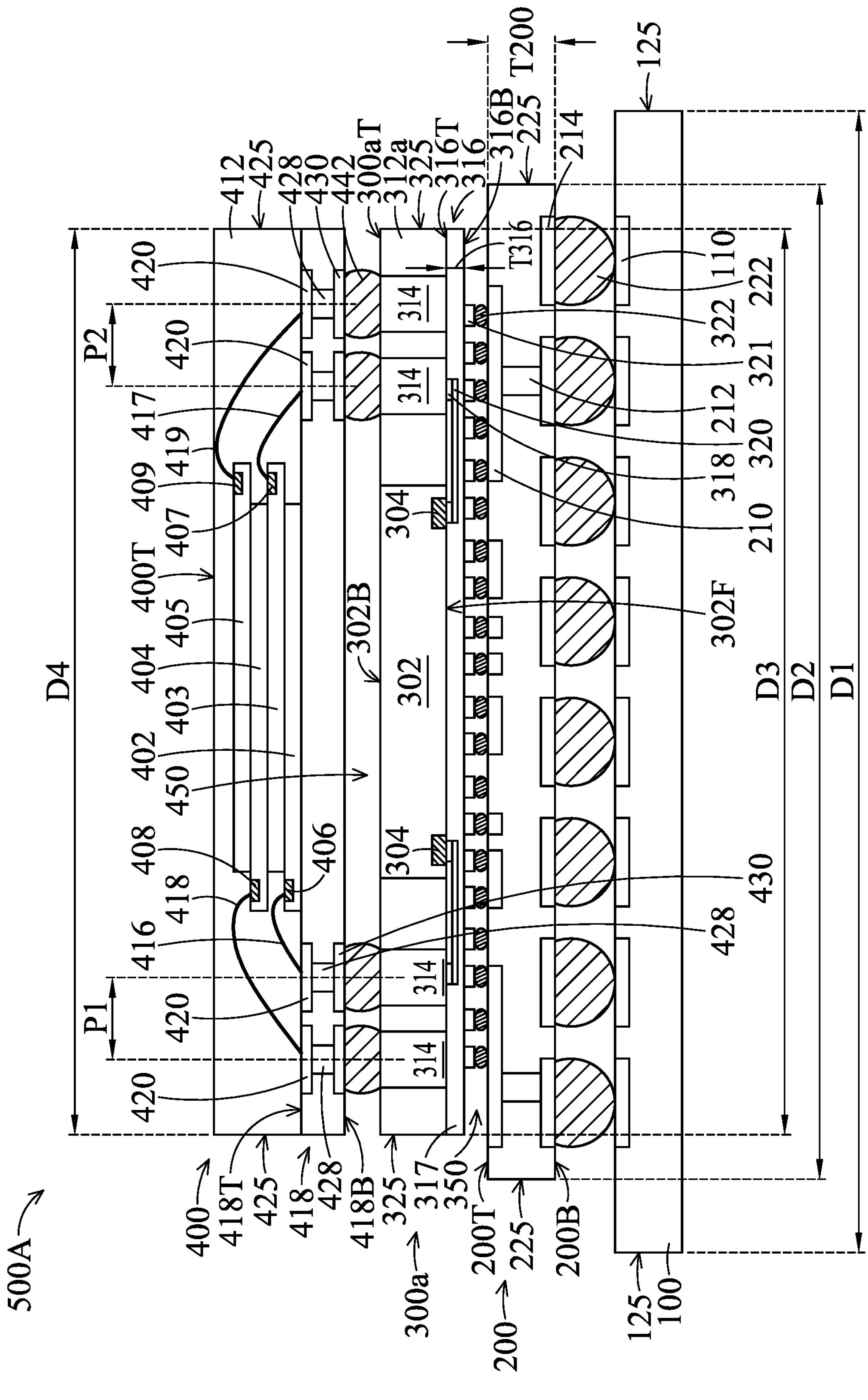
FIG. 1 is a cross-sectional view of a semiconductor package assembly in accordance with some embodiments of the disclosure.

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention Embodiments provide a semiconductor package assembly. The semiconductor package assembly provides a fan-out package surrounded by through via (TV) interconnects and a memory package stacked on it and integrated as a three-dimensional (3D) fan-out molding interposer package on package (FOMIPOP) semiconductor package assembly. In the semiconductor package assembly, the fan-out package uses redistribution layer (RDL) structures on the front surface and the back surface of the logic die to offers finer metal routings for flexible package design. Therefore, the semiconductor package assembly has the improved electrical performance, variable sizes of the fan-out package/substrate and finer size/pitch of routings.

FIG. 1 is a cross-sectional view of a semiconductor package assembly 500A in accordance with some embodiments of the disclosure. In some embodiments, the semiconductor package assembly 500A is a three-dimensional (3D) package-on-package (POP) semiconductor package assembly. The semiconductor package assembly 500A may include at least two vertically stacked wafer-level semiconductor packages mounted on a substrate 200. In addition, the substrate 200 is mounted on a base 100. As shown in FIG. 1, in some embodiments, the semiconductor package assembly 500A includes a fan-out package **300*a* and a memory package 400 vertically stacked on the fan-out package 300*a***.

As shown in FIG. 1, the base 100, for example a printed circuit board (PCB), may be formed of polypropylene (PP), epoxy, polyimide, or other applicable resin materials. It should also be noted that the base 100 can be a single layer or a multilayer structure. The base 100 has a top surface 100T and a pair of parallel side surfaces 125 connected to the top surface 100T. A plurality of contact pads 110 and/or conductive traces (not shown) is disposed close to a top surface 100T of the base 100. In one embodiment, the conductive traces may comprise signal trace segments or ground trace segments, which are used for the input/output (I/O) connections of the substrate 200. Also, the contact pads 110 are disposed close to the substrate 200, connected to different terminals of the conductive traces. The contact pads 110 are used for the substrate 200 that is mounted on them. In some embodiments, the substrate 200 has a lateral dimension D1 between the side surfaces 125 in a cross-sectional view as shown in FIG. 1.

As shown in FIG. 1, the substrate 200 has a top surface 200T, a bottom surface 200B close to the base 100 and a pair of parallel side surfaces 225. The top surface 200T is close to the fan-out package **300*a*. The bottom surface 200B is close to the base 100. In addition, the side surfaces 325 are connected to the top surface 200T and the top surface 200T. The substrate 200 has a lateral dimension D2 between the side surfaces 225 and a thickness T200 in a cross-sectional view as shown in FIG. 1. In some embodiments, the lateral dimension D2 is shorter than or equal to the lateral dimension D1 according to the design requirements. The substrate 200 is provided for the fan-out package 300*a* stack on the top surface 200T. In some embodiments, the substrate 200 includes one or more circuits 212 disposed in one or more extra-low K (ELK) and/or ultra-low K (ULK) dielectric layers (not shown). The circuits 212 are electrically connected to corresponding contact pads (including conductive traces) 210 and contact pads 214. The contact pads (including conductive traces) 210 and the contact pads 214 are exposed to openings of solder mask layers (not shown) disposed close to the top surface 200T and the bottom surface 200B. In some embodiments, the circuits 212, the contact pads 210 and 214 include a conductive material, such as metals comprising copper, gold, silver, or other applicable metals. It should be noted that the number of circuits 212 and the number of contact pads (including conductive traces) 210 and contact pads 214 shown in FIG. 1 is only an example and is not a limitation to the present invention. In addition, conductive structures 222 are disposed on the bottom surface 200B of substrate 200 away from the fan-out package 300*a* and in contact with the corresponding the contact pads 214 of the substrate 200 and the corresponding contact pads 110 of the base 100. Therefore, the substrate 200 is electrically connected to the base 100 via the conductive structures 222. In some embodiments, the conductive structures 222** comprise a conductive ball structure such as a copper ball, a conductive bump structure such as a copper bump or a solder bump structure, or a conductive pillar structure such as a copper pillar structure.

As shown in FIG. 1, the fan-out package **300*a* (also called the system-on-chip (SOC) package 300*a*) is mounted on the top surface 200T of the substrate 200 by a bonding process. The fan-out package 300*a* is mounted on the base 200 using conductive structures 321 and 322. The fan-out package 300*a* is a three-dimensional (3D) semiconductor package including a logic die 302**, a redistribution layer (RDL)

structure 316, through via (TV) interconnects 314 and the conductive structures 321 and 322. The conductive structures 321 and 322 are in contact with the bottom surface 316B and electrically connected to the RDL structure 316. In addition, the conductive structures 321 and 322 are electrically connected to the contact pads (including conductive traces) 210 of the substrate 200. In some embodiments, the conductive structures 321 and 322 comprise a conductive ball structure such as a copper ball, a conductive bump structure such as a copper bump or a solder bump structure, or a conductive pillar structure such as a copper pillar structure. For example, the conductive structures 321 may be conductive pillar structures, and the conductive structures 322 may be conductive bump structures.

The logic die 302 has a front surface 302F and a back surface 302B. The logic die 302 is flipped to be disposed on the RDL structure 316 opposite the conductive structures 321 and 322. The back surface 302B of the logic die 302 is aligned with a top surface 300*a*T of the fan-out package 300*a*. In other words, the back surface 302B of the logic die 302 is exposed from the top surface 300*a*T of the fan-out package 300*a*. The exposed back surface 302B may provide an additional thermal dissipating path to directly dissipate the heat from the logic die 302 to the outside environment. Pads 304 of the logic die 302 are disposed close to the front surface 302F to be electrically connected to the circuitry (not shown) of the logic die 302. In some embodiments, the pads 304 belong to the uppermost metal layer of the interconnection structure (not shown) of the logic die 302. In some embodiments, the logic die 302 includes a central processing unit (CPU), a graphic processing unit (GPU), a dynamic random access memory (DRAM) controller or any combination thereof. In some embodiments, the logic die 302 is fabricated by a flip-chip technology.

The redistribution layer (RDL) structure 316 is disposed between the logic die 302 and the substrate 200. The RDL structure 316 has a top surface 316T and a bottom surface 316B. For example, the top surface 316T may serve as a die-attach surface 316T, and the bottom surface 316B may serve as a bump-attach surface 316B opposite the die-attach surface 316T. The pads 304 of the logic die 302 are in contact with the top surface 316T of the RDL structure 316. In addition, the logic die 302 covers a portion of the top surface 316T of the RDL structure 316. In some embodiments, the RDL structure 316 includes one or more conductive traces 320 and one or more vias 318 disposed in one or more dielectric layers 317. In some embodiments, the conductive traces 320 and the vias 318 include a conductive material, such as metals comprising copper, gold, silver, or other applicable metals. The dielectric layers 317 may include extra-low K (ELK) dielectrics and/or ultra-low K (ULK) dielectric. In addition, the dielectric layers 317 may include epoxy. The pads 304 of the logic die 302 is electrically connected to the substrate 200 using the vias 318 and the conductive traces 320 of the RDL structure 316 and the corresponding conductive structures 321 and 322. It should be noted that the number of vias 318, the number of conductive traces 320 and the number of dielectric layers 317 shown in FIG. 1 is only an example and is not a limitation to the present invention. In some embodiments, the RDL structure 316 has a thickness T316 in a cross-sectional view as shown in FIG. 1. In some embodiments, the thickness T316 of the RDL structure 316 is less than the thickness T200 of the substrate 200. Compared with the conventional package-on-package (PoP) package assembly with directly connections between the logic die and the thick substrate, the fan-out package 300*a* uses the thinner RDL structure 316 directly connected to the logic die 302 for re-routing. Therefore, the extra low K (ELK) stress can be significantly reduced. The CTE (coefficient of thermal expansion) mismatch problem between the logic die 302 and substrate 200 can be improved.

The through via (TV) interconnects 314 are disposed on the top surface 316T of the RDL structure 316 and surrounds the logic die 302. In some embodiments, opposite ends of each TV interconnect 314 are aligned with the front surface 302F and the back surface 302B of the logic die 302. In addition, the end of each TV interconnect 314 aligned with the back surface 302B of the logic die 302 is exposed from the top surface 300*a*T of the fan-out package 300*a*. The end of each TV interconnect 314 aligned with the front surface 302F of the logic die 302 is in contact with the top surface 316T of the RDL structure 316. In some embodiments, the TV interconnects 314 are arranged by a first pitch P1.

As shown in FIG. 1, the TV interconnects 314 are electrically connected to the vias 318 and the conductive traces 320 of the RDL structure 316. In some embodiments, the TV interconnects 314 are electrically connected to the logic die 302 only using the vias 318 and the conductive traces 320 inside the RDL structure 316. In some other embodiments, the TV interconnects 314 are electrically connected to the logic die 302 using the RDL structure 316, the conductive structures 321 and 322 and the contact pads (including conductive traces) 210 outside the RDL structure 316. Since the RDL structure 316 has the thinner thickness and the finer routings (including the vias 318 and the conductive traces 320), the semiconductor package assembly 500A can have improved electrical performances.

As shown in FIG. 1, the fan-out package 300*a* further includes a molding compound 312*a* disposed on and in contact with the top surface 316T of the RDL structure 316. The molding compound 312*a* surrounds the logic die 302 and the TV interconnects 314. In addition, the molding compound 312 is in contact with the TV interconnects 314 and the logic die 302. Furthermore, the TV interconnects 314 pass through the molding compound 312*a*. The back surface 302B of the logic die 302 is exposed from the molding compound 312*a*. In addition, the back surface 302B of the logic die 302 is level with the top surface of the molding compound 312*a*, which also serves as the top surface 300*a*T of the fan-out package 300*a*. In some embodiments, the molded compound 312*a* may be formed of a nonconductive material, such as an epoxy, a resin, a moldable polymer, or the like. The molding compound 312*a* may be applied while substantially liquid, and then may be cured through a chemical reaction, such as in an epoxy or resin. In some other embodiments, the molding compound 312*a* may be an ultraviolet (UV) or thermally cured polymer applied as a gel or malleable solid capable of being disposed around the logic die 302, and then may be cured using a UV or thermally curing process. The molding compound 312*a* may be cured with a mold.

In some embodiments, side surfaces (not shown) of the molding compound 312*a* are respectively aligned with side surfaces (not shown) of the RDL structure 316. Therefore, the side surfaces of the molding compound 312*a* and the side surfaces of the RDL structure 316 may also serve as side surfaces 325 of the fan-out package 300*a*. In some embodiments, the fan-out package 300*a* has a lateral dimension D3 between the side surfaces 325 in a cross-sectional view as shown in FIG. 1. In some embodiments, the lateral dimension D3 is less than or equal to the lateral dimension D2 according to the design requirements. Since the lateral dimension D2 of the substrate 200 and the lateral dimension D3 of the fan-out package 300*a* are both variable and depend on the design requirements. The semiconductor package assembly 500A can achieve the goals of reduced fabrication cost and improved electrical performances.

As shown in FIG. 1, the memory package 400 is stacked on the fan-out package 300*a* by a bonding process. In some embodiments, the memory package 400 comprises a dynamic random access memory (DRAM) package or another applicable memory package. In some embodiments, the memory package 400 includes a substrate 418, at least one memory die, for example, four memory dies 402, 403, 404 and 405 that are stacked on the substrate 418, and conductive structures 442. In some embodiments, each of the memory dies 402, 403, 404 and 405 comprises a dynamic random access memory (DRAM) die or another applicable memory die. The substrate 418 has a top surface 418T and a bottom surface 418B. For example, the top surface 418T may serve as a die-attach surface 418T, and the bottom surface 418B may serve as a bump-attach surface 418B opposite the die-attach surface 418T. In this embodiment, as shown in FIG. 1, there are four memory dies 402, 403, 404 and 405 mounted on the top surface (die-attach surface) 418T of the substrate 418. In addition, the memory dies 402, 403, 404 and 405 cover a portion of the top surface 418T of the substrate 418. The memory dies 403, 404 and 405 are respectively stacked on the memory die 402, 403 and 404 using a paste (not shown), and the memory die 402 is mounted on the top surface 418T of the substrate 418 by a paste (not shown). The memory dies 402, 403, 404 and 405 have corresponding pads 406, 407, 408 and 409 thereon, respectively. The pads 406, 407, 408 and 409 of the memory dies 402, 403, 404 and 405 may be electrically connected to the substrate 418 using bonding wires 416, 417, 418 and 419, respectively. However, the number of stacked memory dies is not limited to the disclosed embodiment. Alternatively, the memory dies 402, 403, 404 and 405 as shown in FIG. 1 can be arranged side by side and mounted on the top surface 418T of the substrate 418 by a paste (not shown). In some embodiments, the substrates 418 and 200 may comprise the same or similar materials and fabrication processes.

As shown in FIG. 1, the substrate 418 may comprise circuits 428 and contact pads 420 and 430. The contact pads 420 are disposed on the tops of the circuits 428 close to the top surface (die-attach surface) 418T of the substrate 418. In addition, the bonding wires 416, 417, 418 and 419 are electrically connected to the corresponding contact pads 420. The contact pads 430 are disposed on the bottoms of the circuits 428 close to the bottom surface (bump-attach surface) 418B of the substrate 418. The contact pads 430 are electrically connected to the corresponding contact pads 420. In some embodiments, the bonding wires 416, 417, 418 and 419, the contact pads 420 and 430 and the circuits 428 include a conductive material, such as metals comprising copper, gold, silver, or other applicable metals.

As shown in FIG. 1, the conductive structures 442 are disposed on the bottom surface 418B of substrate 418 opposite the memory dies 402, 403, 404 and 405. The conductive structures 442 are electrically connected to (or in contact with) the corresponding the contact pads 430 of the substrate 418 and the corresponding TV interconnects 314 of the fan-out package 300*a*. The conductive structures 442 may be arranged by a second pitch P2. The TV interconnects 314 are provided vertical electrical connections to the memory package 400. The first pitch P1 of the TV interconnects 314 can be further reduced with the fan-out technology development. In some embodiments, the second pitch P2 of the conductive structures 442 is different from (less than or greater than) or equal to the first pitch P1 of the TV interconnects 314. In this embodiment, the conductive structures 442 may be arranged by the second pitch P2 corresponding to the first pitch P1. In other words, the conductive structures 442 are disposed directly above the corresponding TV interconnects 314 and arranged by the second pitch P2 that is equal to the first pitch P1. In some embodiments, the conductive structures 222 comprise a conductive ball structure such as a copper ball, a conductive bump structure such as a copper bump or a solder bump structure, or a conductive pillar structure such as a copper pillar structure.

In some embodiments, as shown in FIG. 1, the memory package 400 further includes a molding material 412 covering the top surface 418T of the substrate 418, encapsulating the memory dies 402, 403, 404 and 405 and the bonding wires 416, 417, 418 and 419. The top surface of the molding material 412 may serve as a top surface 400T of the memory package 400. In some embodiments, the molding materials 312*a* and 412 may comprise the same or similar materials and fabrication processes.

In some embodiments, side surfaces (not shown) of the molding compound 412 are respectively aligned with side surfaces (not shown) of the substrate 418. Therefore, the side surfaces of the molding compound 412 and the side surfaces of the substrate 418 may also serve as side surfaces 425 of the memory package 400. In some embodiments, the memory package 400 has a lateral dimension D4 between the side surfaces 425 in a cross-sectional view as shown in FIG. 1. In some embodiments, the lateral dimension D4 is less than or equal to the lateral dimension D2 of the substrate 200 according to the design requirements. In some embodiments, the lateral dimension D4 is different form (e.g. less than) or equal to the lateral dimension D3 of the fan-out package 300*a* according to the design requirements.

In some embodiments, the memory dies 402, 403, 404 and 405 of the memory package 400 are electrically connected to the logic die 302 of the fan-out package 300*a* using the substrate 418, the conductive structures 442, the TV interconnects 314 and the RDL structure 316 and without using the substrate 200. In some other embodiments, the memory dies 402, 403, 404 and 405 are electrically connected to the logic die 302 using the substrate 418, the conductive structures 442, the TV interconnects 314 and the RDL structure 316 and the substrate 200. In addition, the memory package 400 may be electrically connected to the substrate 200 using the logic die 302 of the fan-out package 300*a*. In detail, the memory dies 402, 403, 404 and 405 of the memory package 400 are electrically connected to the logic die 302 of the fan-out package 300*a* using the substrate 418, the conductive structures 442, the TV interconnects 314 and the RDL structure 316, and the logic die 302 is electrically connected to the substrate 200 using the RDL structure 316 and the conductive structures 321 and 322.

Figure 2:
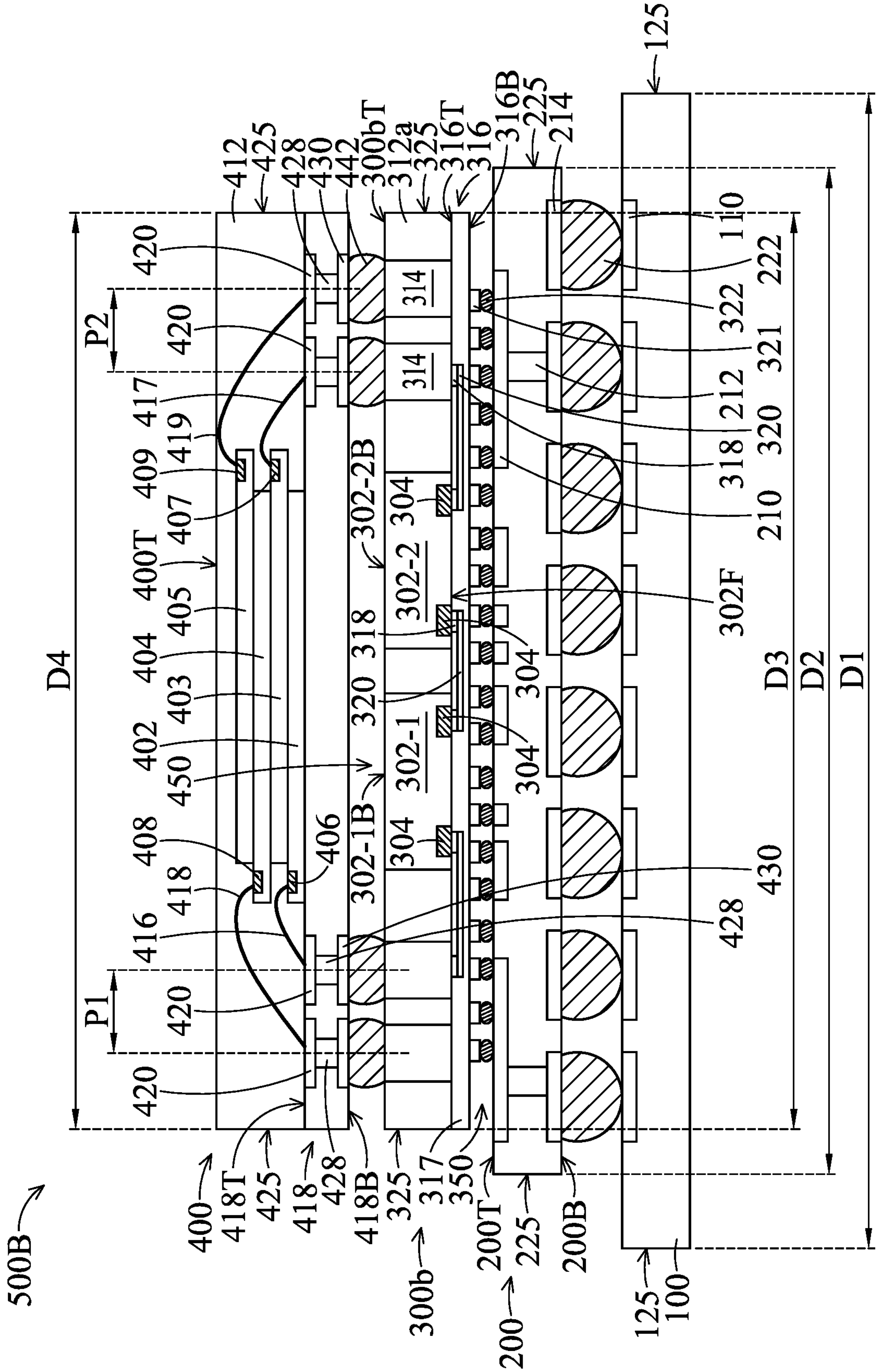
FIG. 2 is a cross-sectional view of a semiconductor package assembly in accordance with some embodiments of the disclosure.

FIG. 2 is a cross-sectional view of a semiconductor package assembly in accordance with some embodiments of the disclosure. Elements of the embodiments hereinafter, that are the same or similar as those previously described with reference to FIG. 1, are not repeated for brevity. As shown in FIG. 2, the difference between the semiconductor package assembly 500A and the semiconductor package assembly 500B is that the semiconductor package assembly 500B includes a fan-out package 300*b* having multi logic dies, for example, two logic dies 302-1 and 302-2. The logic dies 302-1 and 302-2 are disposed on the top surface 316T of the RDL structure 316 and surrounded by the TV interconnects 314. In addition, the logic die is disposed beside the logic die 302-1. Back surfaces 302-1B and 302-2B of the logic dies 302-1 and 302-2 are exposed from a top surface 300*b*T of the fan-out package 300*b*. In some embodiments, the logic die 302-1 is electrically connected to the logic die 302-2 using the vias 318 and the conductive traces 320 of the RDL structure 316. The logic dies 302-1 and 302-2 are electrically connected to the TV interconnects 314 using the vias 318 and the conductive traces 320 of the RDL structure 316.

FIGS. 3-10 are cross-sectional views of semiconductor package assemblies 500C-500J in accordance with some embodiments of the disclosure, showing the arrangements of molding compounds 312*b*-312*e* and/or underfills 460*a* and 460*b*. Elements of the embodiments hereinafter, that are the same or similar as those previously described with reference to FIGS. 1-2, are not repeated for brevity.

Figure 3:
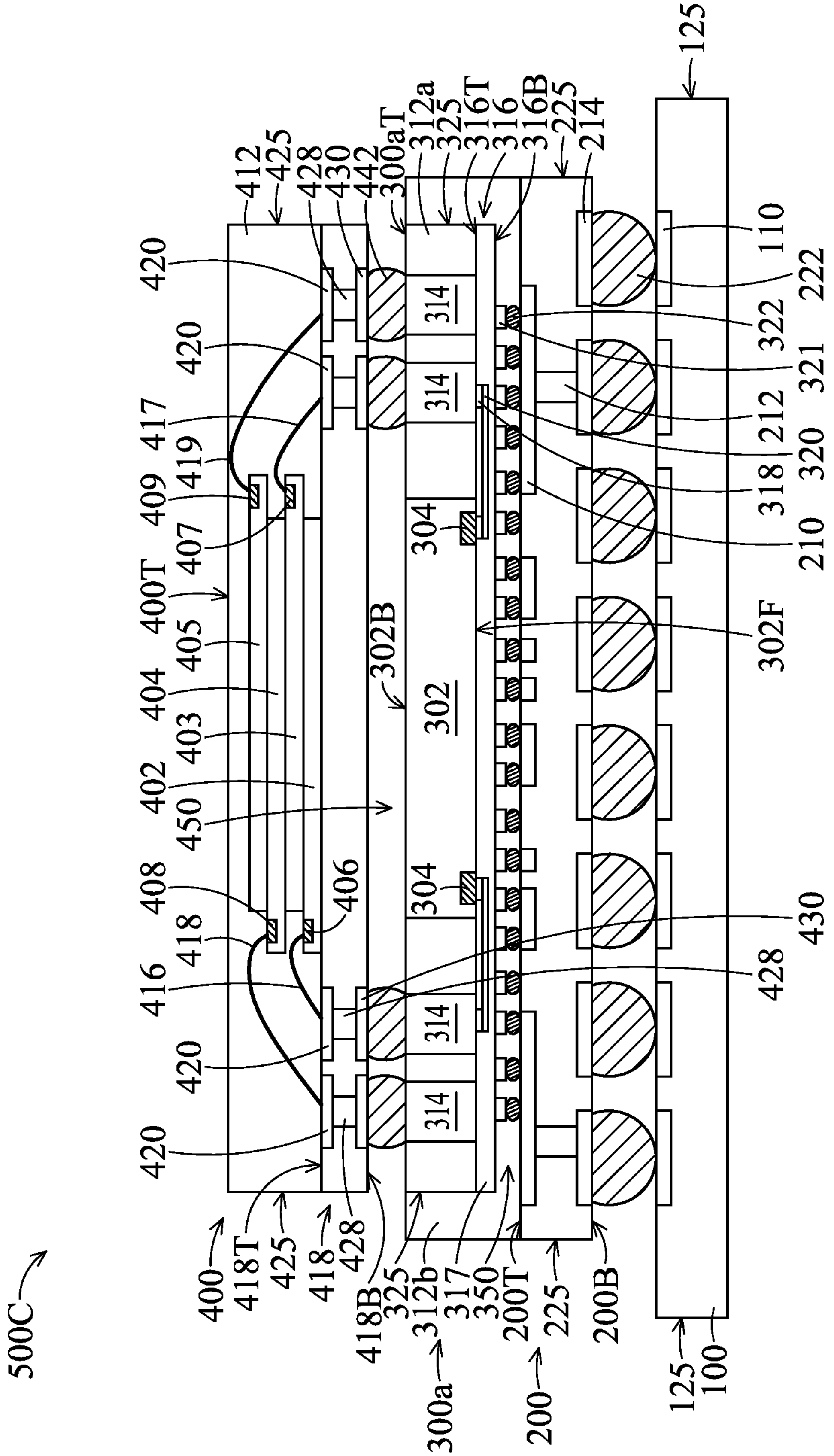
FIGS. 3-10 are cross-sectional views of a semiconductor package assembly in accordance with some embodiments of the disclosure, showing the arrangements of a molding compound and/or an underfill.

As shown in FIG. 3, the difference between the semiconductor package assembly 500A and the semiconductor package assembly 500C is that the semiconductor package assembly 500C further includes a molding compound 312*b* filling a gap 350 (FIG. 1) between the fan-out package 300*a* and the substrate 200 and surrounding the conductive structures 321 and 322. In addition, the molding compound 312*b* surrounds the fan-out package 300*a*. In some embodiments, the top surface (not shown) of the molding compound 312*b* may be level with the top surface 300*a*T of the fan-out package 300*a*. Side surfaces (not shown) of the molding compound 312*b* may be level with the side surfaces 225 of the substrate 200. The molding compound 312*b* may be formed after mounting the fan-out package 300*a* on the substrate 200. The molding compound 312*b* may help to reduce the thermal resistance from the fan-out package 300*a* to the substrate 200. In some embodiments, the molding compounds 312*a*, 312*b* and 412 may comprise the same or similar materials and fabrication processes.

Figure 4:
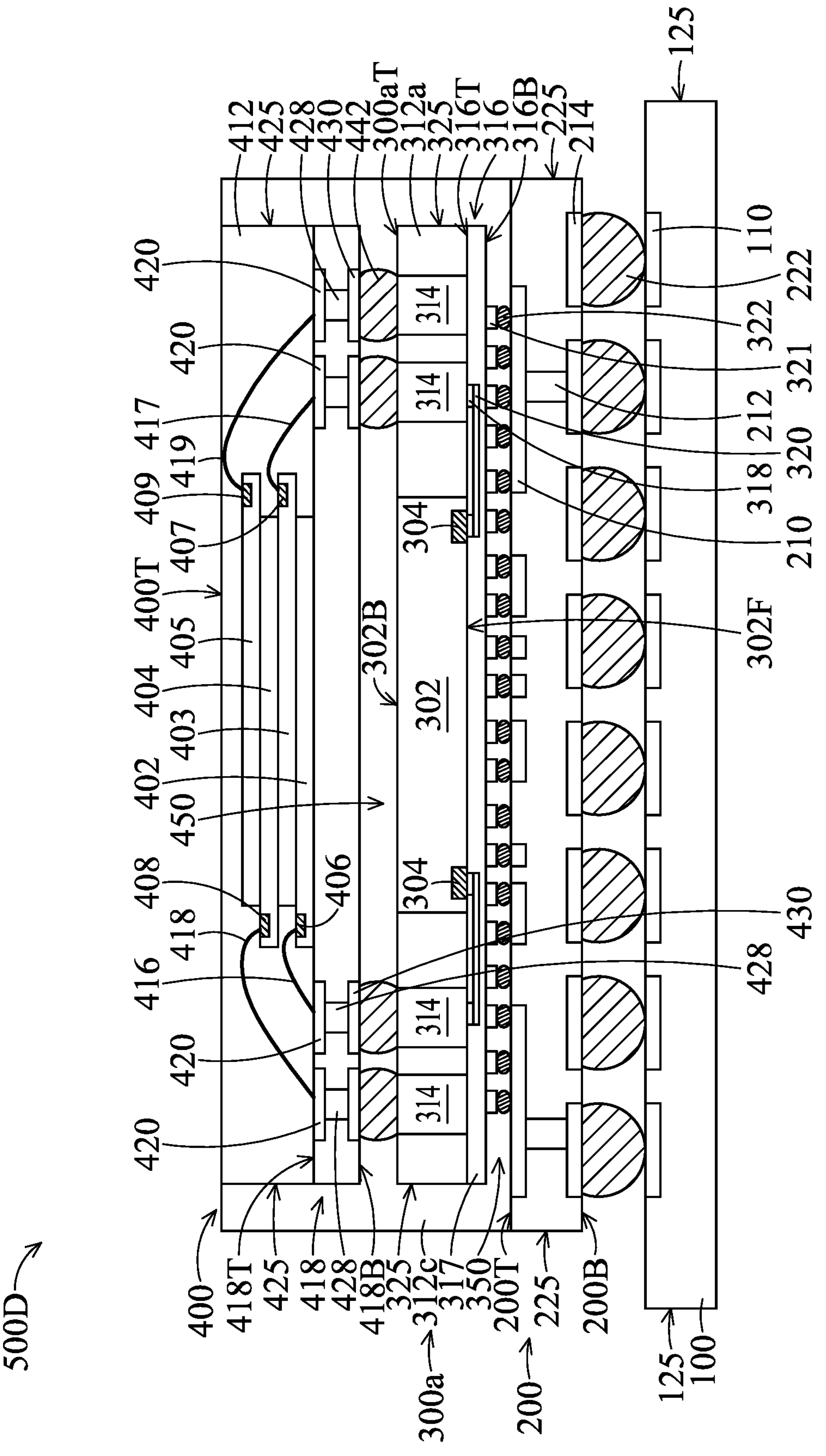

As shown in FIG. 4, the difference between the semiconductor package assembly 500A and the semiconductor package assembly 500D is that the semiconductor package assembly 500D further includes a molding compound 312*c* filling the gap 350 (FIG. 1) between the fan-out package 300*a* and the substrate 200 and a gap 450 (FIG. 1) between the fan-out package 300*a* and the memory package 400. The molding compound 312*c* surrounds the conductive structures 321, 322 and 442. In addition, the molding compound 312*c* surrounds the fan-out package 300*a* and the memory package 400. In some embodiments, the top surface (not shown) of the molding compound 312*c* may be level with the top surface 400T of the memory package 400. Side surfaces (not shown) of the molding compound 312*c* may be level with the side surfaces 225 of the substrate 200. The molding compound 312*c* may be formed after mounting the fan-out package 300*a* on the substrate 200 and after mounting the memory package 400 on the fan-out package 300*a*. The molding compound 312*c* may help to dissipate heat generated form the logic die 302 and reduce the thermal resistance from the fan-out package 300*a* to the memory package 400 and the thermal resistance from the fan-out package 300*a* to the substrate 200. In some embodiments, the molding compounds 312*a*, 312*b*, 312*c* and 412 may comprise the same or similar materials and fabrication processes.

Figure 5:
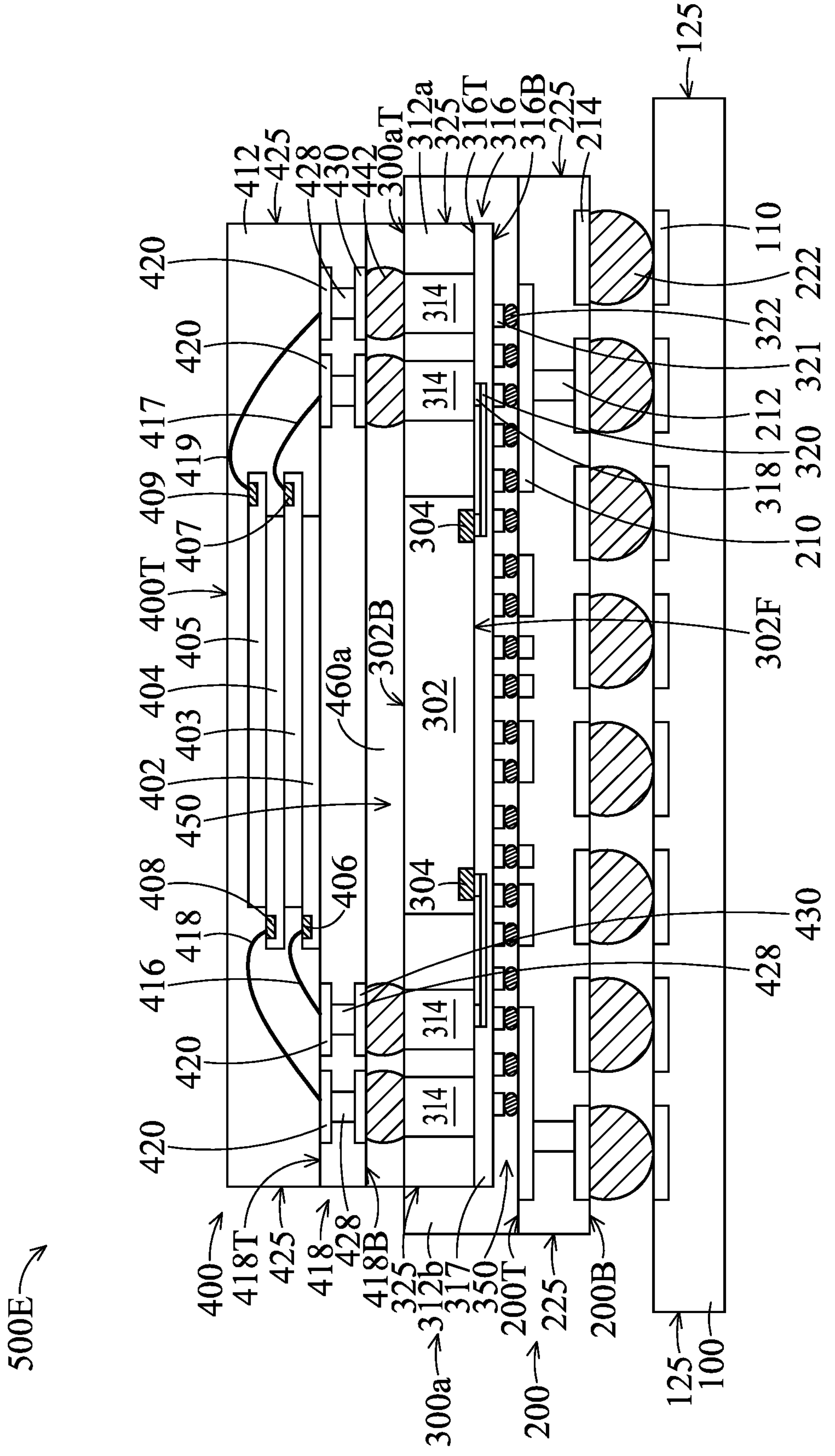

As shown in FIG. 5, the difference between the semiconductor package assembly 500C and the semiconductor package assembly 500E is that the semiconductor package assembly 500E further includes an underfill 460*a* filling the gap 450 between the fan-out package 300*a* and the memory package 400 and surrounding the conductive structures 442. The underfill 460*a* covers and is in contact with the back surface 302B of the logic die 302 and the top surface 300*a*T of the fan-out package 300*a*. In some embodiments, side surfaces (not shown) of the underfill 460*a* may be level with the side surfaces 425 of the memory package 400. The underfill 460*a* may help to dissipate heat generated form the logic die 302 and to reduce the thermal resistance from the fan-out package 300*a* to the memory package 400. In some embodiments, the underfill 460*a* includes a capillary underfill (CUF), a molded underfill (MUF), or a combination thereof.

Figure 6:
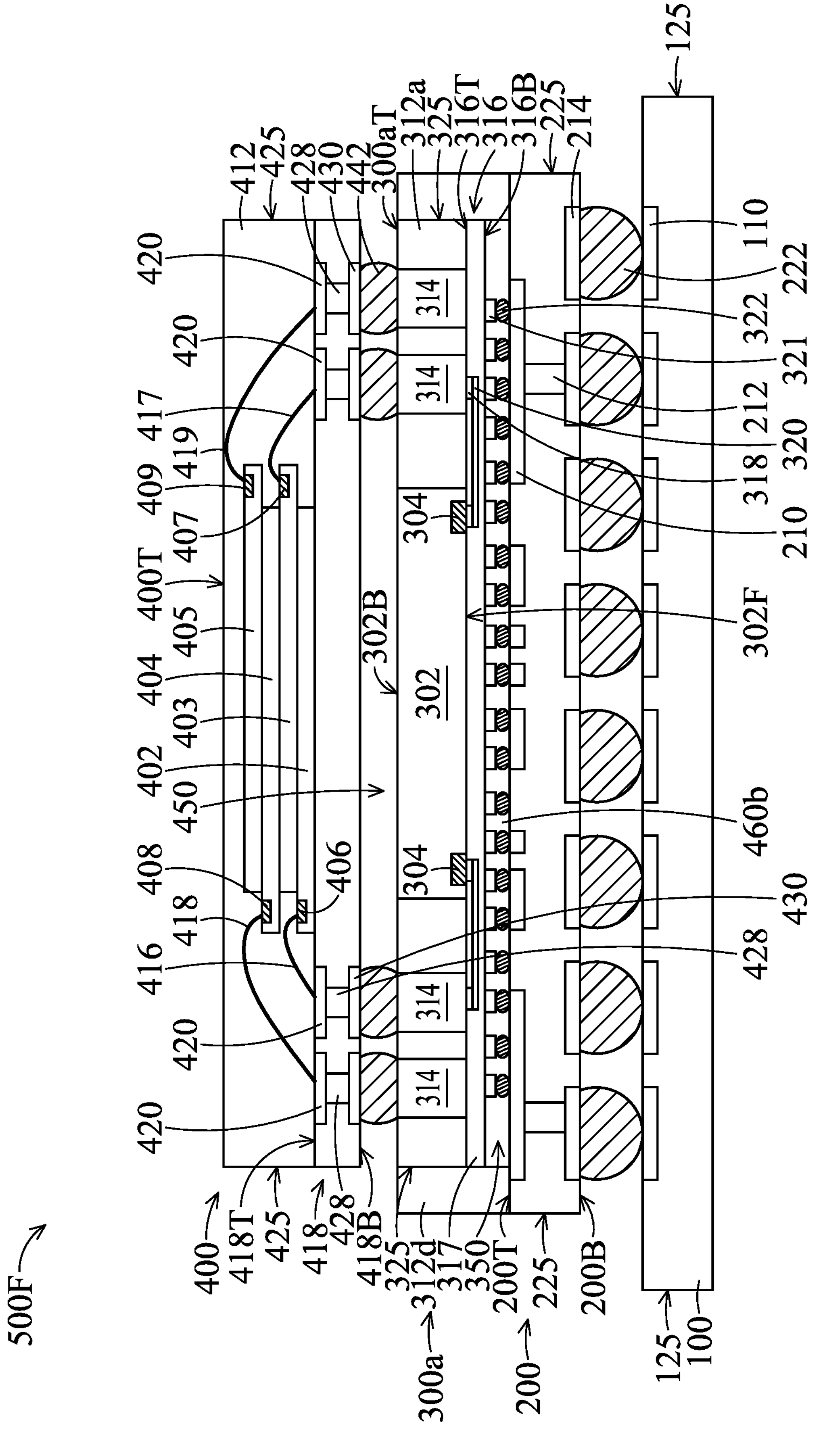

As shown in FIG. 6, the difference between the semiconductor package assembly 500A and the semiconductor package assembly 500E is that the semiconductor package assembly 500E further includes an underfill 460*b* and a molding compound 312*d*. The underfill 460*b* fills the gap 350 (FIG. 1) between the fan-out package 300*a* and the substrate 200 and surrounds the conductive structures 321 and 322. The underfill 460*b* covers the bottom surface 316B of the RDL structure 316 and the top surface 200T of the substrate 200. The molding compound 312*d* is disposed on the top surface 200T of the substrate 200 and surrounds the fan-out package 300*a* and the underfill 460*b*. In some embodiments, the top surface (not shown) of the molding compound 312*d* may be level with the top surface 300*a*T of the fan-out package 300*a*. Side surfaces (not shown) of the molding compound 312*d* is level with the side surfaces 225 of the substrate 200. Side surfaces (not shown) of the underfill 460*b* may be level with the side surfaces 325 of the fan-out package 300*a*. The underfill 460*b* may be formed after mounting the fan-out package 300*a* on the substrate 200. The molding compound 312*d* may formed after introducing the underfill 460*b* into the gap 350 (FIG. 1) between the fan-out package 300*a* and the substrate 200. The underfill 460*b* and the molding compound 312*d* may help to dissipate heat generated form the logic die 302 and to reduce the thermal resistance from the fan-out package 300*a* to the memory package 400. In some embodiments, the molding compounds 312*a*, 312*b*, 312*c*, 312*d* and 412 may comprise the same or similar materials and fabrication processes. In some embodiments, the underfill 460*a* and 460*b* may comprise the same or similar materials and fabrication processes.

Figure 7:
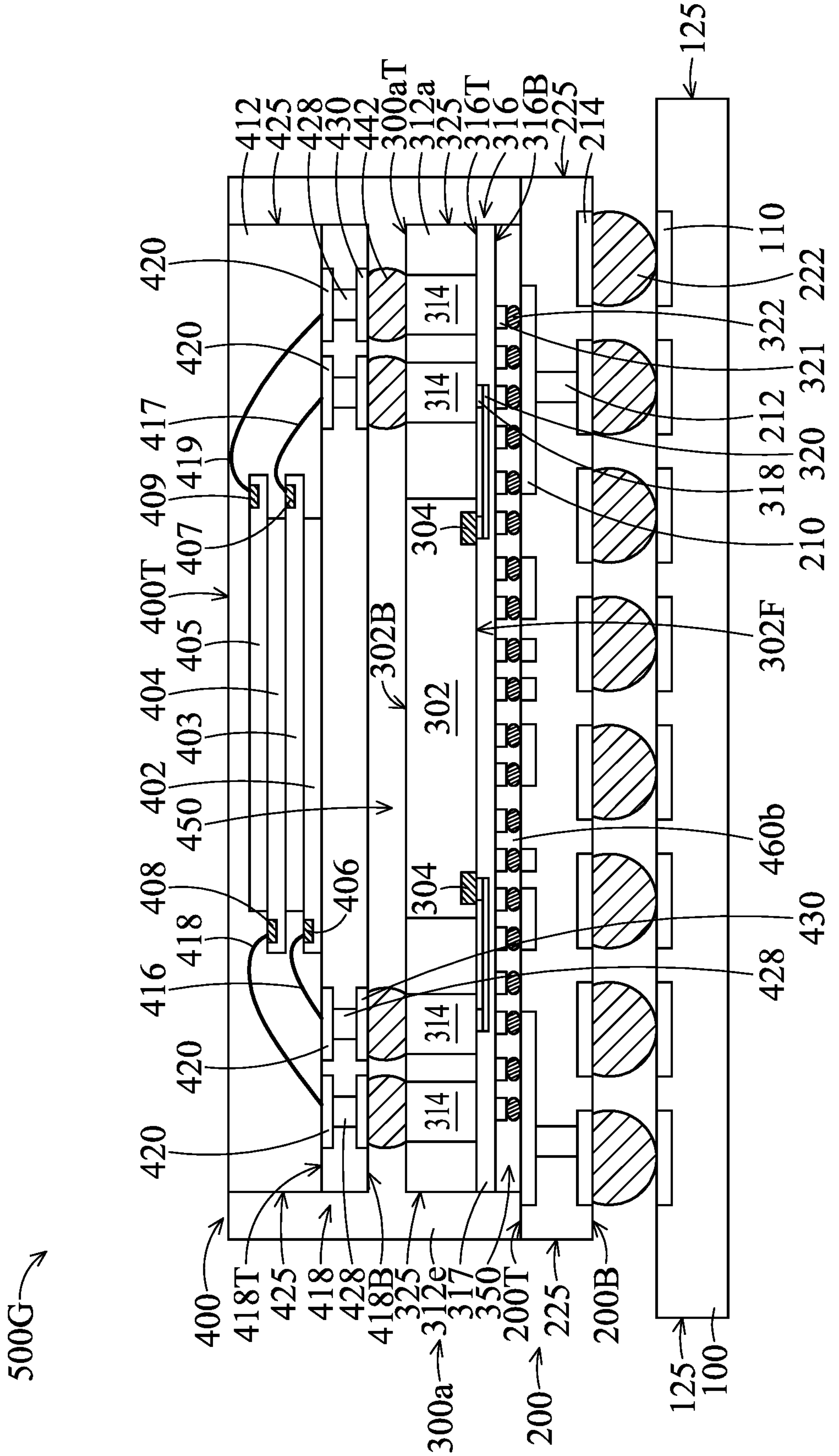

As shown in FIG. 7, the difference between the semiconductor package assembly 500F and the semiconductor package assembly 500G is that the semiconductor package assembly 500G further includes a molding compound 312*e* filling the gap 350 (FIG. 1) between the fan-out package 300*a* and the substrate 200. The molding compound 312*e* surrounds the conductive structures 442. In addition, the molding compound 312*e* surrounds the fan-out package 300*a* and the memory package 400. In some embodiments, the top surface (not shown) of the molding compound 312*e* may be level with the top surface 400T of the memory package 400. Side surfaces (not shown) of the molding compound 312*e* may be level with the side surfaces 225 of the substrate 200. The molding compound 312*e* may be formed after mounting the fan-out package 300*a* on the substrate 200 and after mounting the memory package 400 on the fan-out package 300*a*. In addition, the molding compound 312*e* may formed after introducing the underfill 460*b* into the gap 350 (FIG. 1) between the fan-out package 300*a* and the substrate 200. The molding compound 312*e* may help to dissipate heat generated form the logic die 302 and reduce the thermal resistance from the fan-out package 300*a* to the memory package 400 and the thermal resistance from the fan-out package 300*a* to the substrate 200. In some embodiments, the molding compounds 312*a*, 312*b*, 312*c*, 312*d*, 312*e* and 412 may comprise the same or similar materials and fabrication processes.

Figure 8:
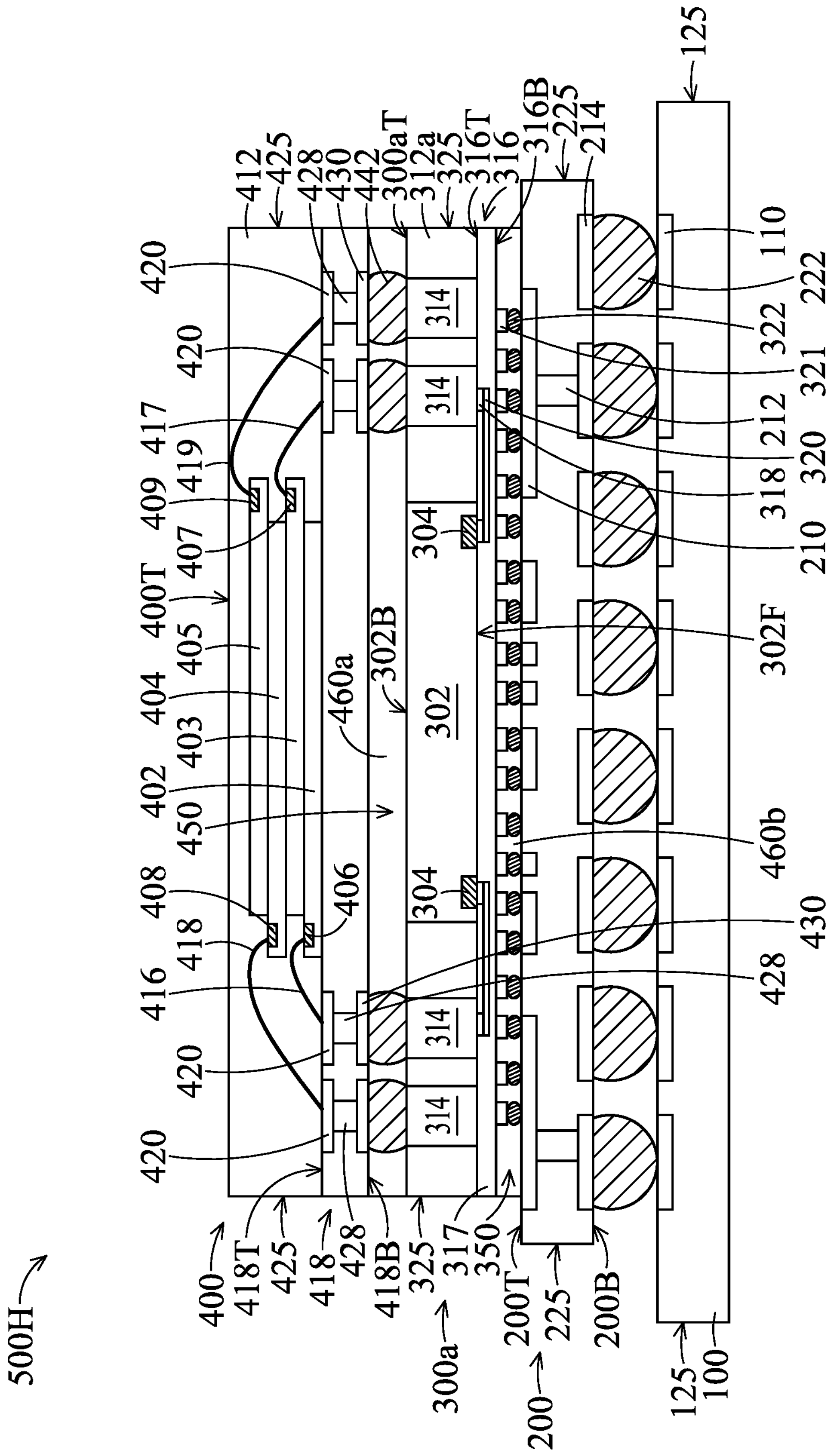

As shown in FIG. 8, the difference between the semiconductor package assembly 500H and the semiconductor package assembly 500A is that the semiconductor package assembly 500H further includes the underfills 460*a* and 460*b*. The underfill 460*a* fills the gap 450 (FIG. 1) between the fan-out package 300*a* and the memory package 400 and surrounding the conductive structures 442. The underfill 460*a* covers the back surface 302B of the logic die 302 and the top surface 300*a*T of the fan-out package 300*a*. The underfill 460*b* fills the gap 350 (FIG. 1) between the fan-out package 300*a* and the substrate 200 and surrounds the conductive structures 321 and 322. The underfill 460*b* covers the bottom surface 316B of the RDL structure 316 and the top surface 200T of the substrate 200. In some embodiments, side surfaces (not shown) of the underfill 460*a* may be level with the side surfaces 425 of the memory package 400. Side surfaces (not shown) of the underfill 460*b* may be level with the side surfaces 325 of the fan-out package 300*a*. The underfill 460*b* may be formed after mounting the fan-out package 300*a* on the substrate 200. The underfill 460*a* may be formed after mounting the memory package 400 on the fan-out package 300*a*. The underfills 460*a* and 460*b* may help to reduce the thermal resistance from the fan-out package 300*a* to the memory package 400 and the thermal resistance from the fan-out package 300*a* to the memory package 400.

Figure 9:
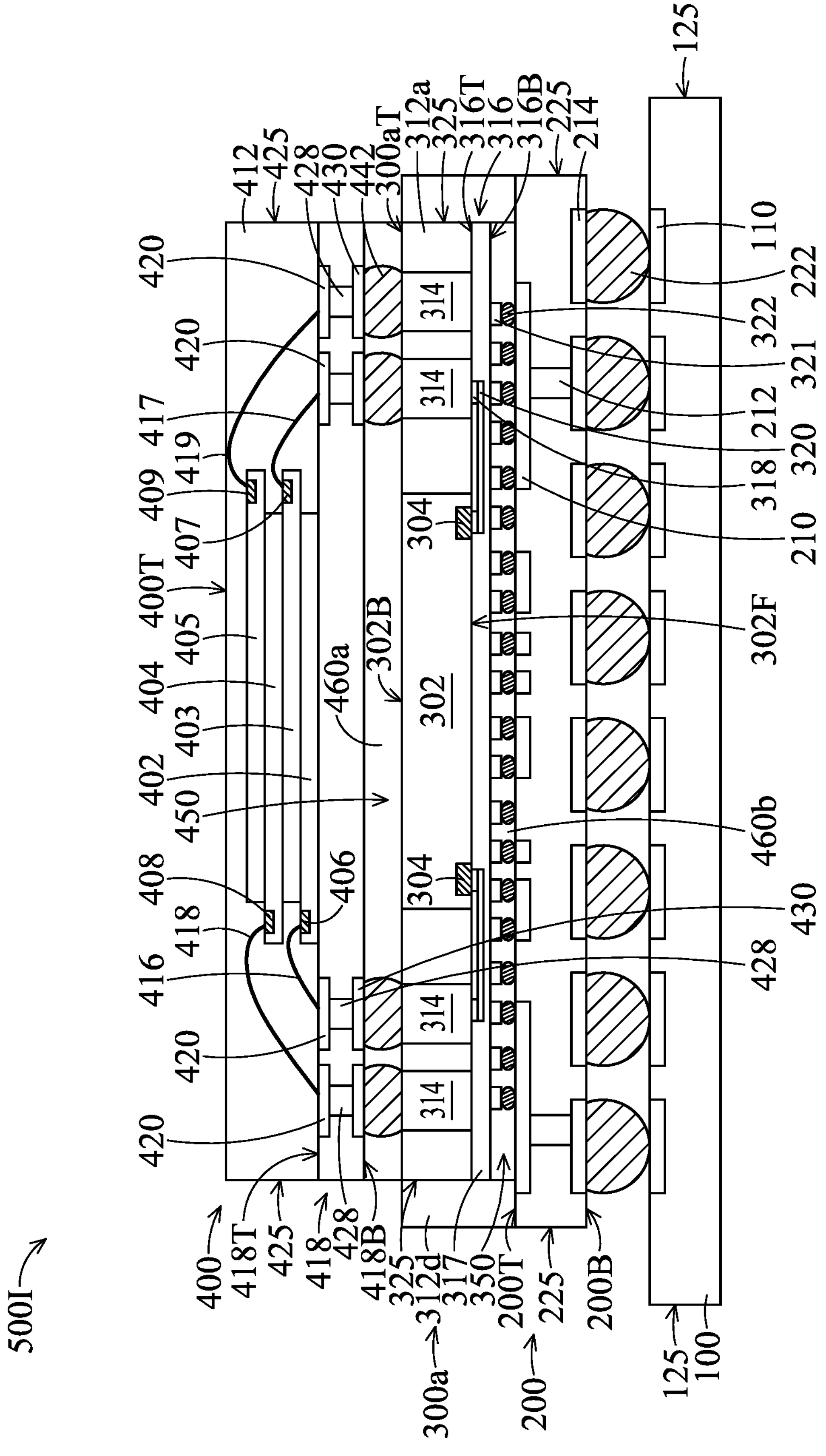

As shown in FIG. 9, the difference between the semiconductor package assembly 500H and the semiconductor package assembly 500I is that the semiconductor package assembly 500I further includes the molding compound 312*d* surrounds the fan-out package 300*a* and the underfill 460*b*.

Figure 10:
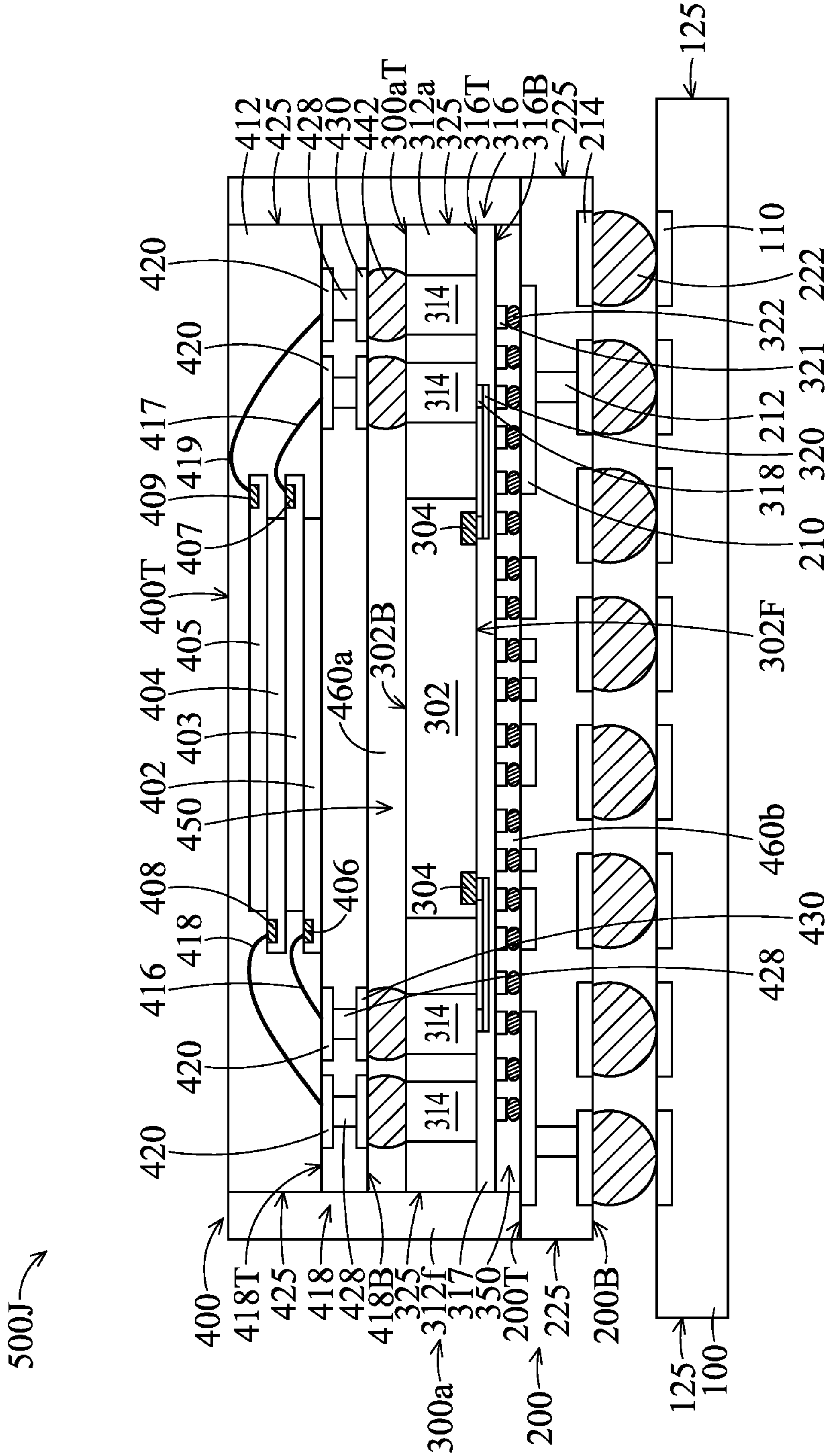

As shown in FIG. 10, the difference between the semiconductor package assembly 500I and the semiconductor package assembly 500J is that the semiconductor package assembly 500J further includes a molding compound 312*f* disposed on the substrate 200 and surrounding the fan-out package 300*a* and the memory package 400. The molding compound 312*f* may further help to reduce the thermal resistance from the fan-out package 300*a* to the memory package 400 and the thermal resistance from the fan-out package 300*a* to the memory package 400. In some embodiments, the molding compounds 312*a*, 312*b*, 312*c*, 312*d*, 312*e*, 312*f* and 412 may comprise the same or similar materials and fabrication processes.

Figure 11:
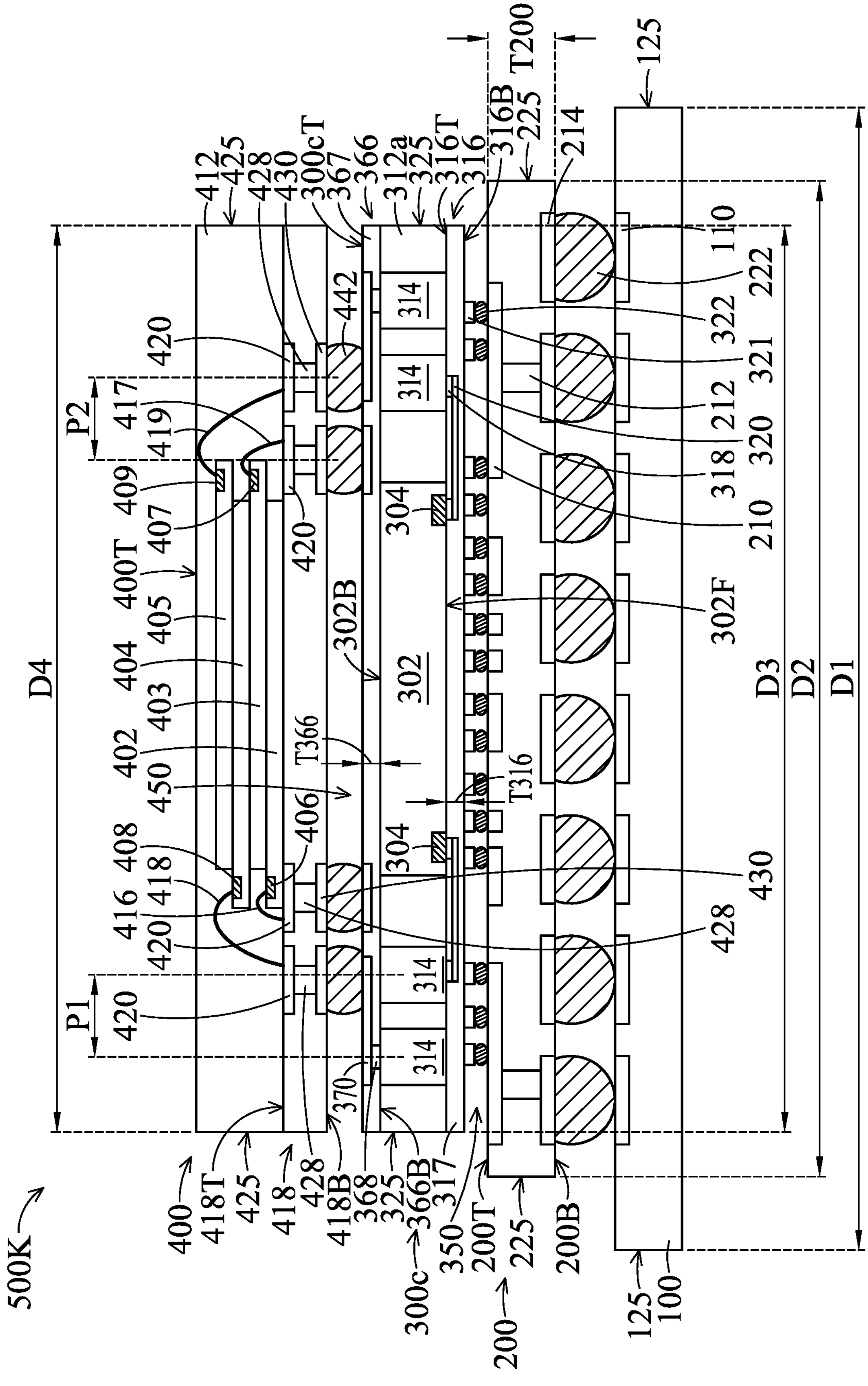
FIG. 11 is a cross-sectional view of a semiconductor package assembly in accordance with some embodiments of the disclosure.

FIG. 11 is a cross-sectional view of a semiconductor package assembly 500K in accordance with some embodiments of the disclosure. Elements of the embodiments hereinafter, that are the same or similar as those previously described with reference to FIGS. 1-10, are not repeated for brevity. As shown in FIG. 11, the difference between the semiconductor package assembly 500A and the semiconductor package assembly 500K is that the semiconductor package assembly 500K includes a fan-out package 300*c*. The fan-out package 300*b* further includes a redistribution layer (RDL) structure 366 disposed on the logic die 302 and the TV interconnects 314 and opposite the RDL structure 316. The RDL structure 366 has a top surface (not shown) and a bottom surface 366B. The top surface of the RDL structure 366 may serve as the top surface 300*b*T of the fan-out package 300*c*. The bottom surface 316B is in contact with the molding compound 312*a*. The RDL structure 366 is electrically connected to and in contact with the TV interconnects 314 of the fan-out package 300*c* and the conductive structures 442 of the memory package 400. The RDL structure 316 and the RDL structure 366 are in contact with the front surface 302F and the back surface 302B of the logic die 302, respectively. In addition, the RDL structure 316 and the RDL structure 366 are in contact with opposite ends of the TV interconnects 314, respectively. In other word, the logic die 302 and the TV interconnects 314 are sandwiched between the RDL structure 316 and the RDL structure 366.

In some embodiments, the RDL structure 366 includes one or more conductive traces 370 and one or more vias 368 disposed in one or more dielectric layers 367. The conductive structures 442 of the memory package 400 are electrically connected to the TV interconnects 314 of the fan-out package 300*c* using the vias 368 and the conductive traces 370 of the RDL structure 366. It should be noted that the number of vias 368, the number of conductive traces 370 and the number of dielectric layers 367 shown in FIG. 11 is only an example and is not a limitation to the present invention.

In some embodiments, the RDL structure 366 disposed on the back surface 302B of the logic die 302 provides flexible routing design for the TV interconnects 314 of the fan-out package 300*c* and the conductive structures 442 of the memory package 400 in different locations and/or pitches. In this embodiment, the conductive structures 442 are not required to be disposed directly above the corresponding TV interconnects 314. The second pitch P2 of the conductive structures 442 may be different from (less than or greater than) or equal to the first pitch P1 of the TV interconnects 314. In some embodiments, the thickness T366 of the RDL structure 366 is less than the thickness T200 of the substrate 200. In addition, the fan-out package 300*c* is fabricated without a thick interposer provided for the electrical connections to the memory package 400. Therefore, the height of the semiconductor package assembly 500K can be further thinned down. The thermal resistance from the fan-out package 300*c* to the memory package 400 can be further reduced.

Figure 12:
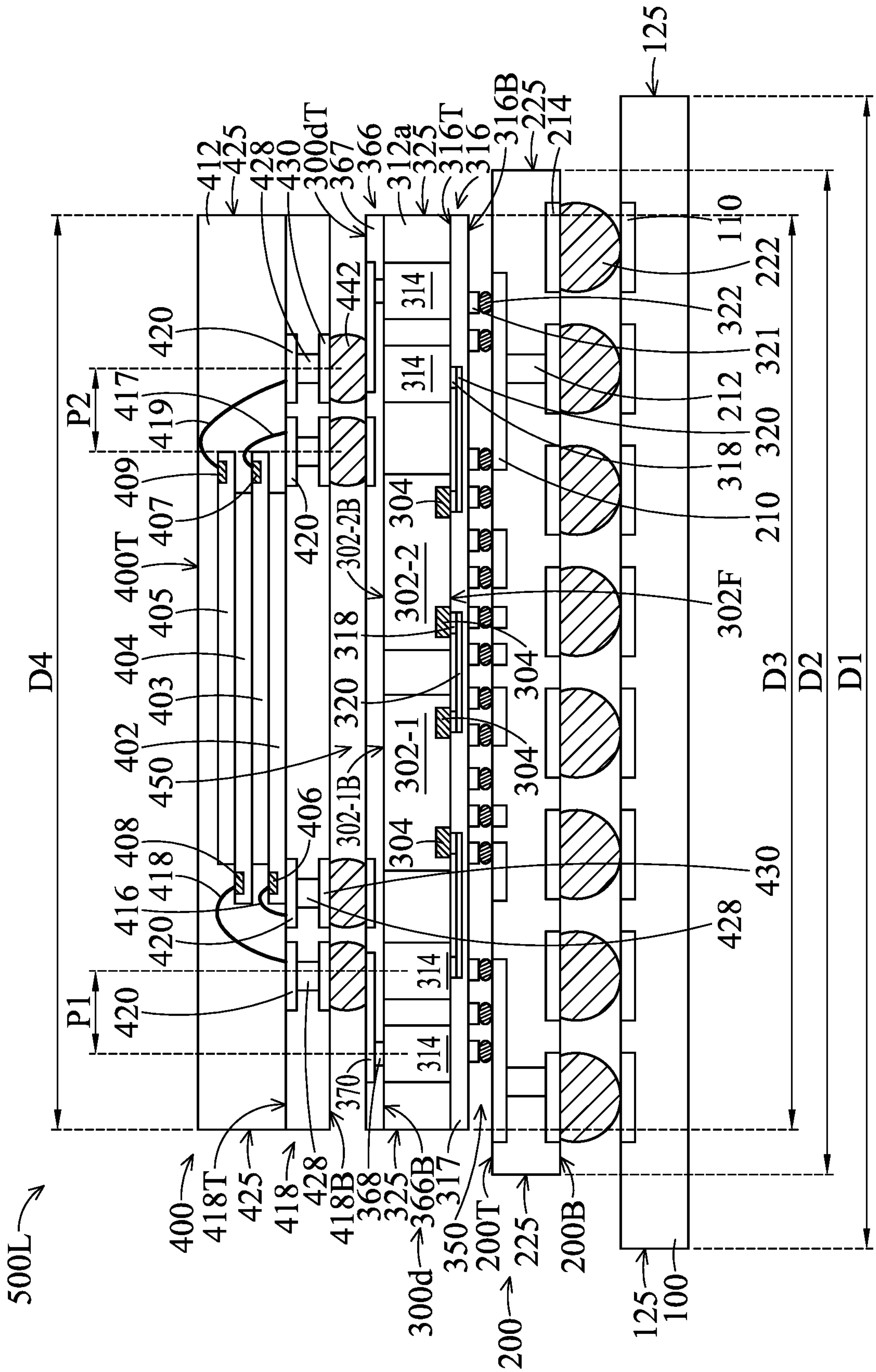
FIG. 12 is a cross-sectional view of a semiconductor package assembly in accordance with some embodiments of the disclosure.

FIG. 12 is a cross-sectional view of a semiconductor package assembly 500L in accordance with some embodiments of the disclosure. Elements of the embodiments hereinafter, that are the same or similar as those previously described with reference to FIGS. 1-11, are not repeated for brevity.

As shown in FIG. 12, the difference between the semiconductor package assembly 500K and the semiconductor package assembly 500L is that the semiconductor package assembly 500L includes a fan-out package 300*d* having multi logic dies, for example, two logic dies 302-1 and 302-2. The back surfaces 302-1B and 302-2B of the logic dies 302-1 and 302-2 are covered by the RDL structure 366. The top surface of the RDL structure 366 may serve as the top surface 300*d*T of the fan-out package 300*d*.

FIGS. 13-20 are cross-sectional views of semiconductor package assemblies 500M-500U in accordance with some embodiments of the disclosure, showing the arrangements of the molding compounds 312*b*-312*e* and/or the underfills 460*a* and 460*b*. Elements of the embodiments hereinafter, that are the same or similar as those previously described with reference to FIGS. 1-12, are not repeated for brevity.

Figure 13:
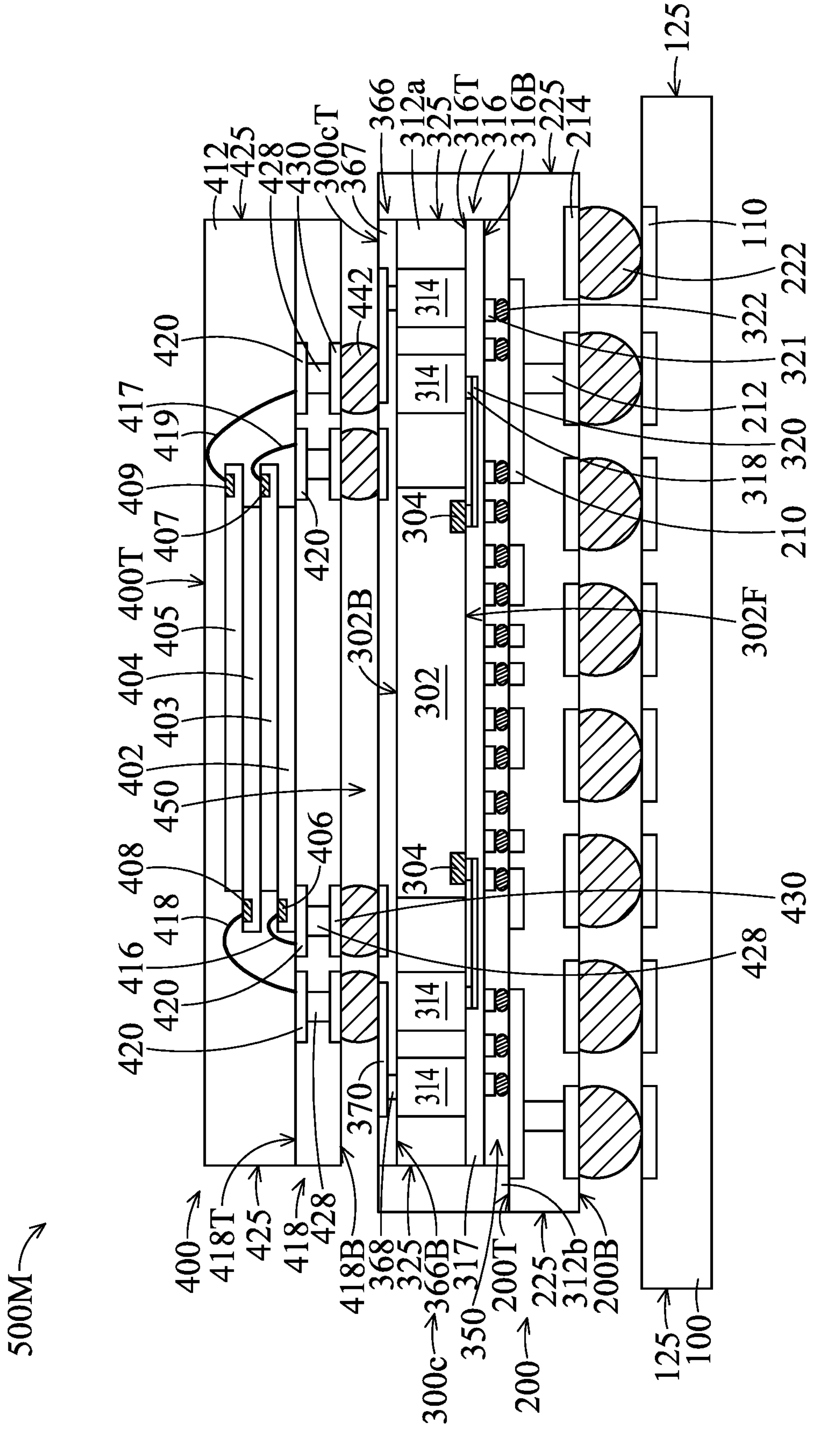
FIGS. 13-20 are cross-sectional views of a semiconductor package assembly in accordance with some embodiments of the disclosure, showing the arrangements of a molding compound and/or an underfill.

As shown in FIG. 13, the difference between the semiconductor package assembly 500K and the semiconductor package assembly 500M is that the semiconductor package assembly 500M further includes the molding compound 312*b* filling the gap 350 (FIG. 11) between the fan-out package 300*c* and the substrate 200 and surrounding the conductive structures 321 and 322. In addition, the molding compound 312*b* surrounds the fan-out package 300*c*. In some embodiments, the top surface (not shown) of the molding compound 312*b* may be level with the top surface 300*c*T of the fan-out package 300*c*. Side surfaces (not shown) of the molding compound 312*b* may be level with the side surfaces 225 of the substrate 200. The molding compound 312*b* may be formed after mounting the fan-out package 300*c* on the substrate 200. The molding compound 312*b* may help to reduce the thermal resistance from the fan-out package 300*c* to the substrate 200.

Figure 14:
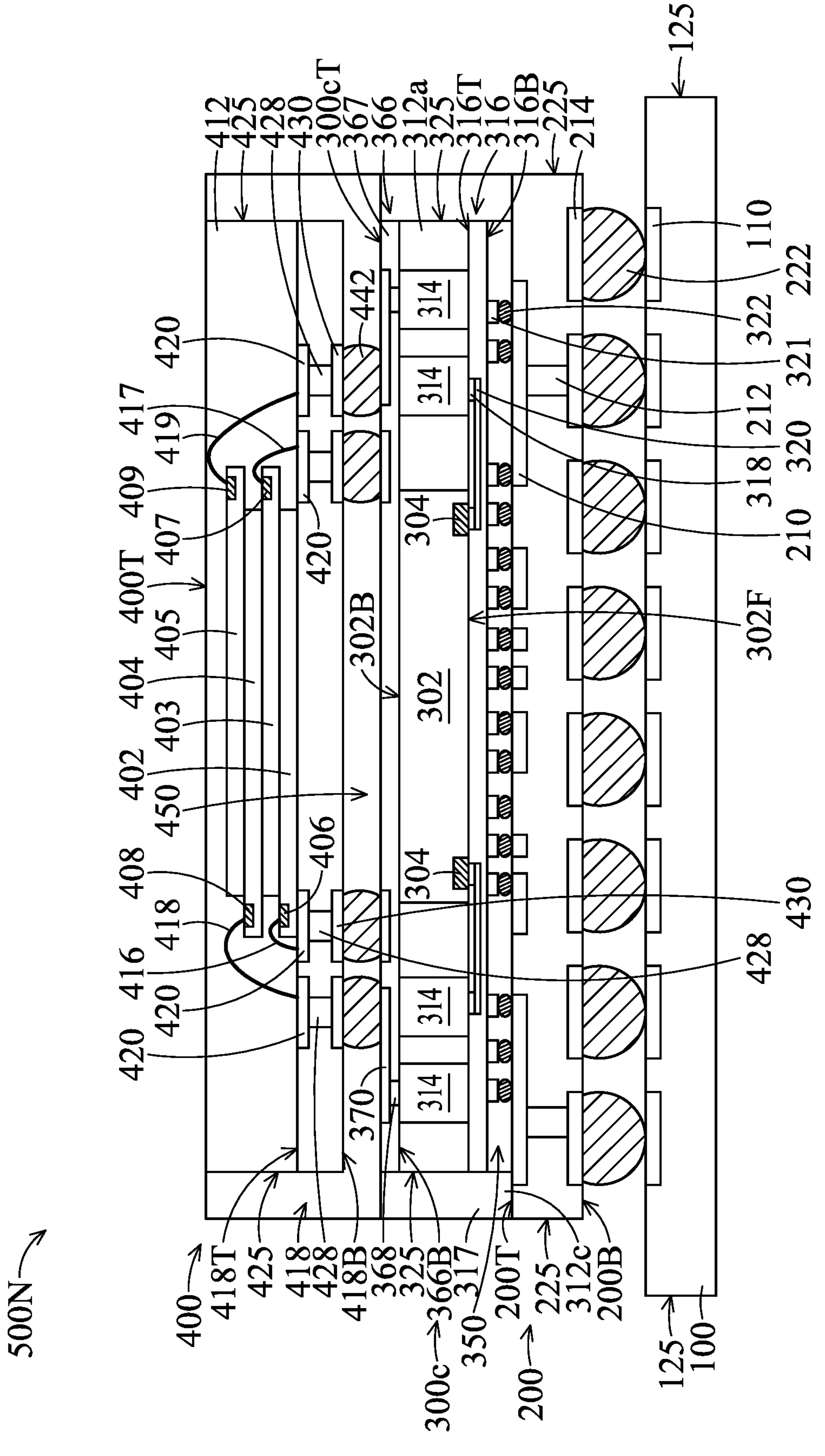

As shown in FIG. 14, the difference between the semiconductor package assembly 500K and the semiconductor package assembly 500N is that the semiconductor package assembly 500N further includes the molding compound 312*c* filling the gap 350 (FIG. 11) between the fan-out package 300*c* and the substrate 200 and the gap 450 (FIG. 11) between the fan-out package 300*c* and the memory package 400. The molding compound 312*c* surrounds the conductive structures 321, 322 and 442. In addition, the molding compound 312*c* surrounds the fan-out package 300*c* and the memory package 400. In some embodiments, the top surface (not shown) of the molding compound 312*c* may be level with the top surface 400T of the memory package 400. Side surfaces (not shown) of the molding compound 312*c* may be level with the side surfaces 225 of the substrate 200. The molding compound 312*c* may be formed after mounting the fan-out package 300*c* on the substrate 200 and after mounting the memory package 400 on the fan-out package 300*c*. The molding compound 312*c* may help to dissipate heat generated form the logic die 302 and reduce the thermal resistance from the fan-out package 300*c* to the memory package 400 and the thermal resistance from the fan-out package 300*c* to the substrate 200.

Figure 15:
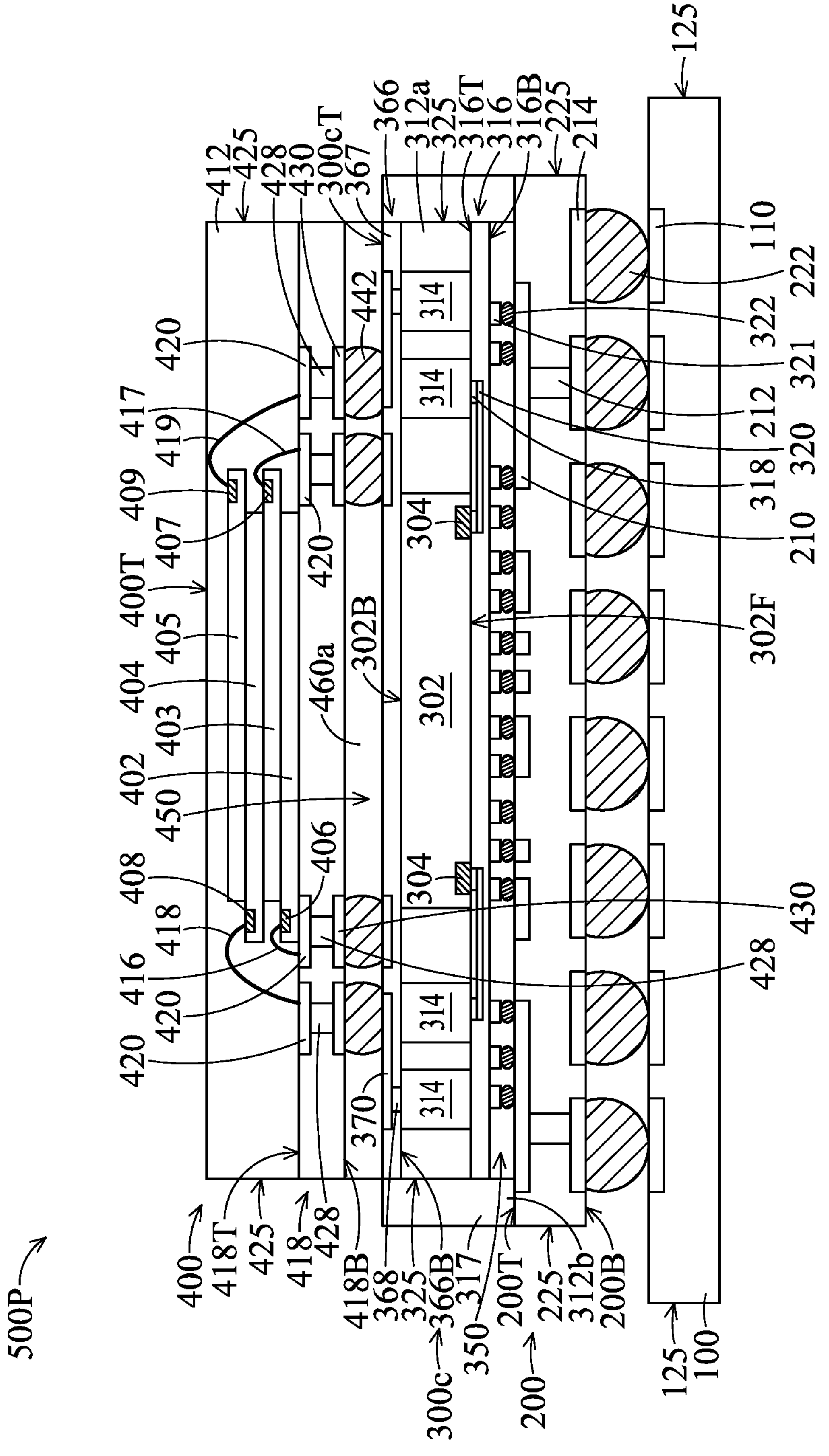

As shown in FIG. 15, the difference between the semiconductor package assembly 500M and the semiconductor package assembly 500P is that the semiconductor package assembly 500P further includes an underfill 460*a* filling the gap 450 between the fan-out package 300*c* and the memory package 400 and surrounding the conductive structures 442. The underfill 460*a* covers the RDL structure 366 and the top surface 300*c*T of the fan-out package 300*c*. In some embodiments, side surfaces (not shown) of the underfill 460*a* may be level with the side surfaces 425 of the memory package 400. The underfill 460*a* may help to dissipate heat generated form the logic die 302 and to reduce the thermal resistance from the fan-out package 300*c* to the memory package 400.

Figure 16:
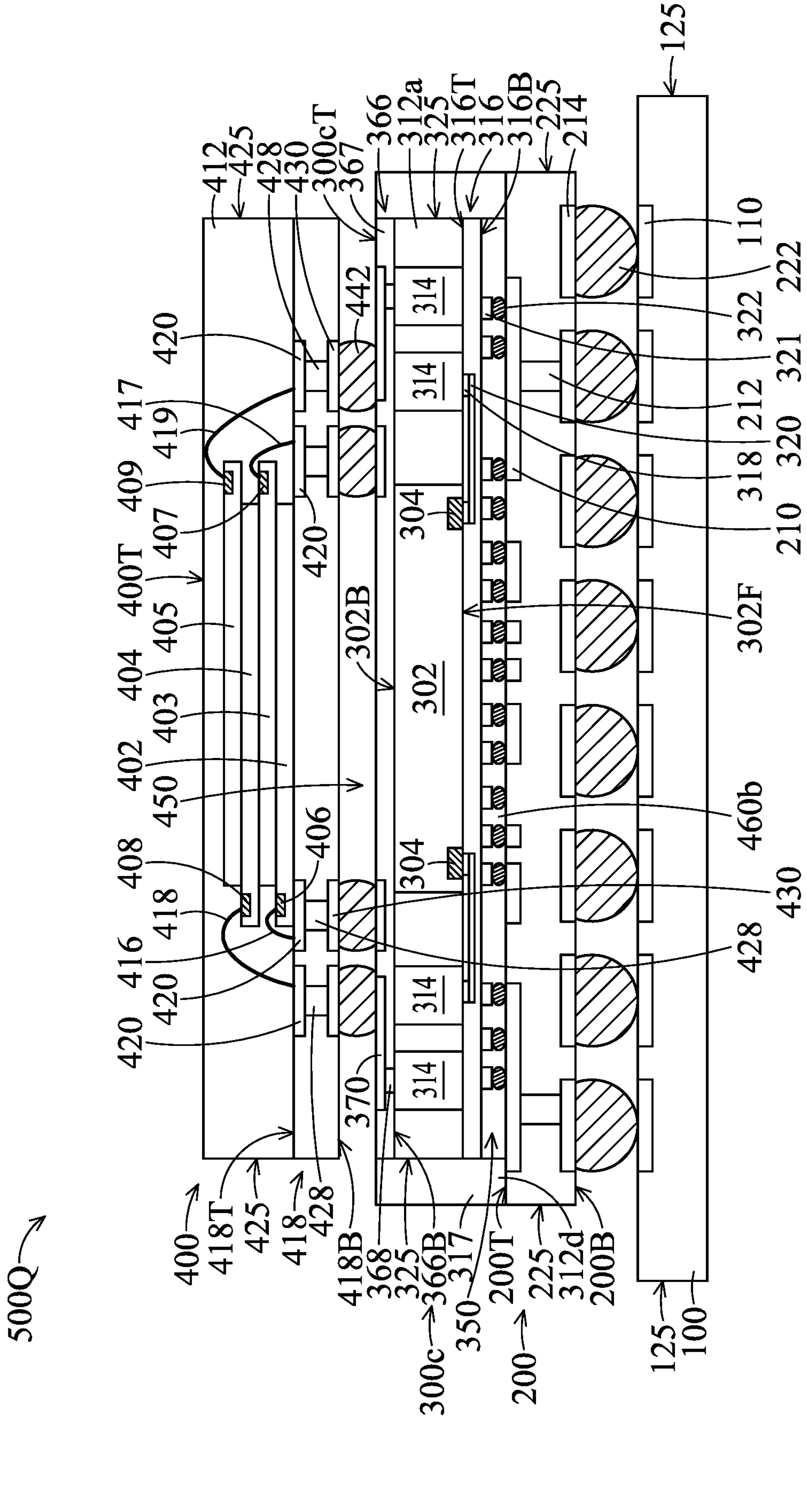

As shown in FIG. 16, the difference between the semiconductor package assembly 500K and the semiconductor package assembly 500Q is that the semiconductor package assembly 500Q further includes the underfill 460*b* and the molding compound 312*d*. The underfill 460*b* fills the gap 350 (FIG. 11) between the fan-out package 300*c* and the substrate 200 and surrounds the conductive structures 321 and 322. The underfill 460*b* covers the bottom surface 316B of the RDL structure 316 and the top surface 200T of the substrate 200. The molding compound 312*d* is disposed on the top surface 200T of the substrate 200 and surrounds the fan-out package 300*c* and the underfill 460*b*. In some embodiments, the top surface (not shown) of the molding compound 312*d* may be level with the top surface 300*c*T of the fan-out package 300*c*. Side surfaces (not shown) of the molding compound 312*d* is level with the side surfaces 225 of the substrate 200. Side surfaces (not shown) of the underfill 460*b* may be level with the side surfaces 325 of the fan-out package 300*c*. The underfill 460*b* may be formed after mounting the fan-out package 300*c* on the substrate 200. The molding compound 312*d* may formed after introducing the underfill 460*b* into the gap 350 (FIG. 1) between the fan-out package 300*c* and the substrate 200. The underfill 460*b* and the molding compound 312*d* may help to dissipate heat generated form the logic die 302 and to reduce the thermal resistance from the fan-out package 300*c* to the memory package 400.

Figure 17:
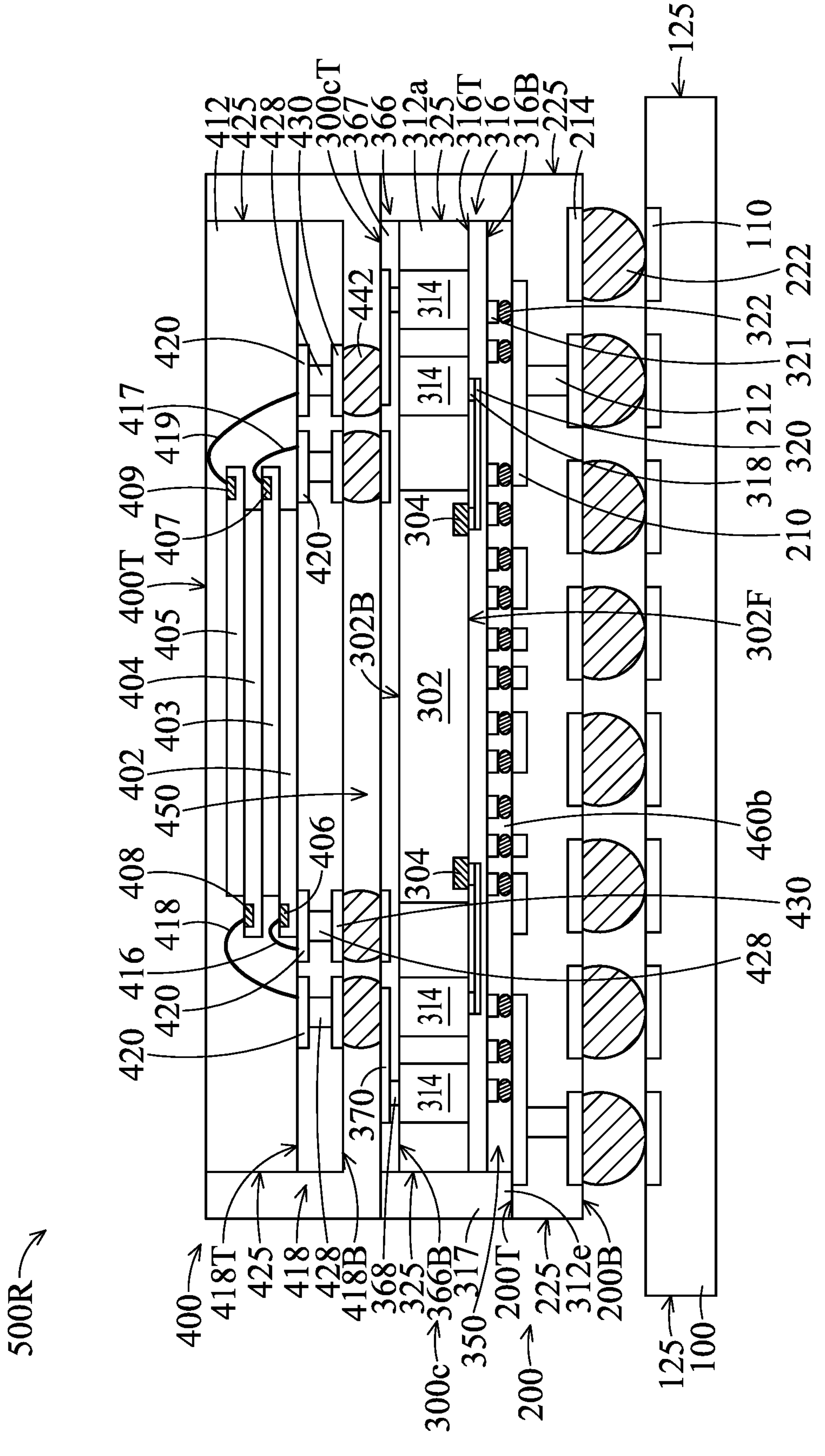

As shown in FIG. 17, the difference between the semiconductor package assembly 500Q and the semiconductor package assembly 500R is that the semiconductor package assembly 500R further includes the molding compound 312*e* filling the gap 350 (FIG. 11) between the fan-out package 300*c* and the substrate 200. The molding compound 312*e* surrounds the conductive structures 442. In addition, the molding compound 312*e* surrounds the fan-out package 300*c* and the memory package 400. In some embodiments, the top surface (not shown) of the molding compound 312*e* may be level with the top surface 400T of the memory package 400. Side surfaces (not shown) of the molding compound 312*e* may be level with the side surfaces 225 of the substrate 200. The molding compound 312*e* may be formed after mounting the fan-out package 300*c* on the substrate 200 and after mounting the memory package 400 on the fan-out package 300*c*. In addition, the molding compound 312*e* may formed after introducing the underfill 460*b* into the gap 350 (FIG. 1) between the fan-out package 300*c* and the substrate 200. The molding compound 312*e* may help to dissipate heat generated form the logic die 302 and reduce the thermal resistance from the fan-out package 300*c* to the memory package 400 and the thermal resistance from the fan-out package 300*c* to the substrate 200.

Figure 18:
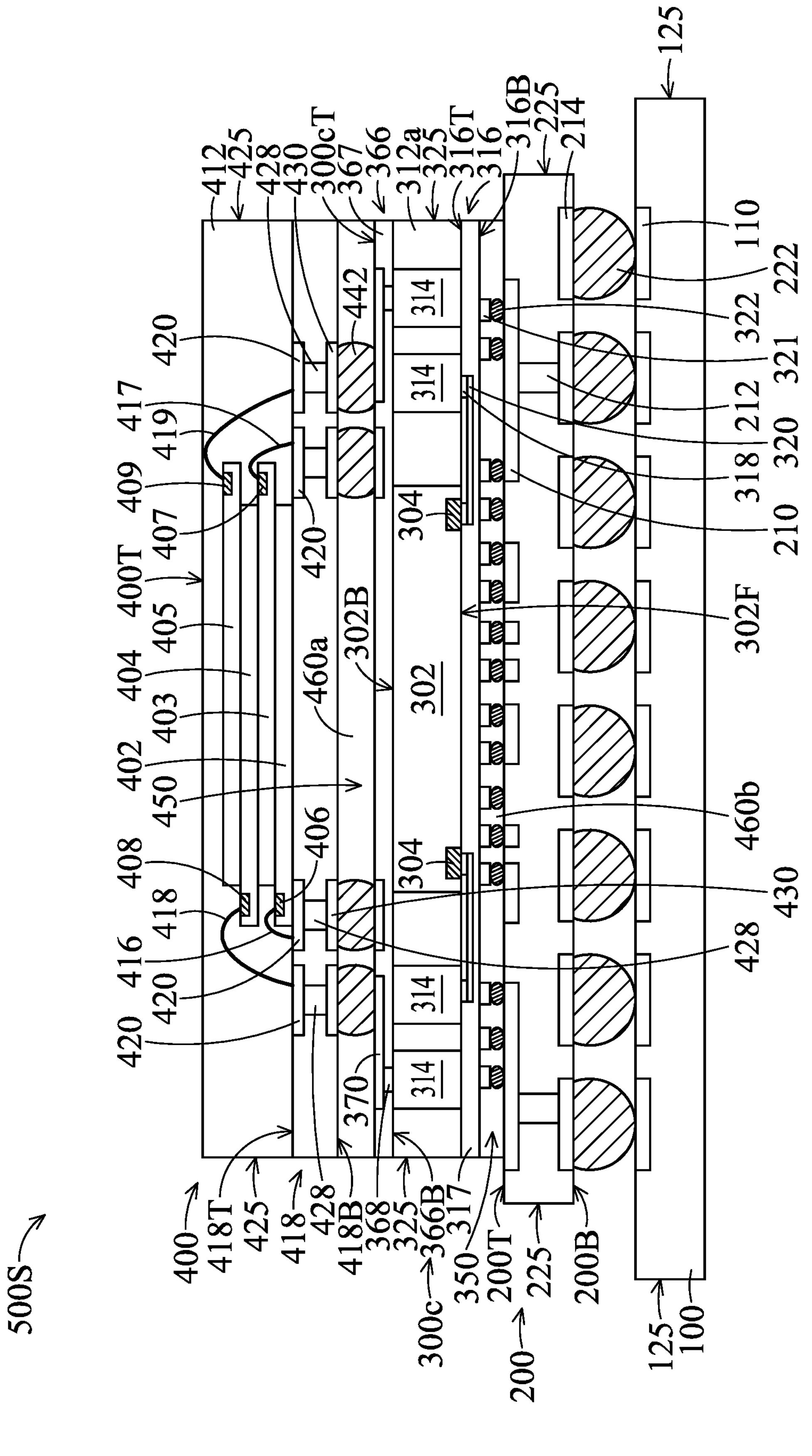

As shown in FIG. 18, the difference between the semiconductor package assembly 500K and the semiconductor package assembly 500S is that the semiconductor package assembly 500S further includes the underfills 460*a* and 460*b*. The underfill 460*a* fills the gap 450 (FIG. 11) between the fan-out package 300*c* and the memory package 400 and surrounding the conductive structures 442. The underfill 460*a* covers the RDL structure 366 and the top surface 300*c*T of the fan-out package 300*c*. The underfill 460*b* fills the gap 350 (FIG. 1) between the fan-out package 300*c* and the substrate 200 and surrounds the conductive structures 321 and 322. The underfill 460*b* covers the bottom surface 316B of the RDL structure 316 and the top surface 200T of the substrate 200. In some embodiments, side surfaces (not shown) of the underfill 460*a* may be level with the side surfaces 425 of the memory package 400. Side surfaces (not shown) of the underfill 460*b* may be level with the side surfaces 325 of the fan-out package 300*c*. The underfill 460*b* may be formed after mounting the fan-out package 300*c* on the substrate 200. The underfill 460*a* may be formed after mounting the memory package 400 on the fan-out package 300*c*. The underfill 460*a* may help to reduce the thermal resistance from the fan-out package 300*c* to the memory package 400 and the thermal resistance from the fan-out package 300*c* to the memory package 400.

Figure 19:
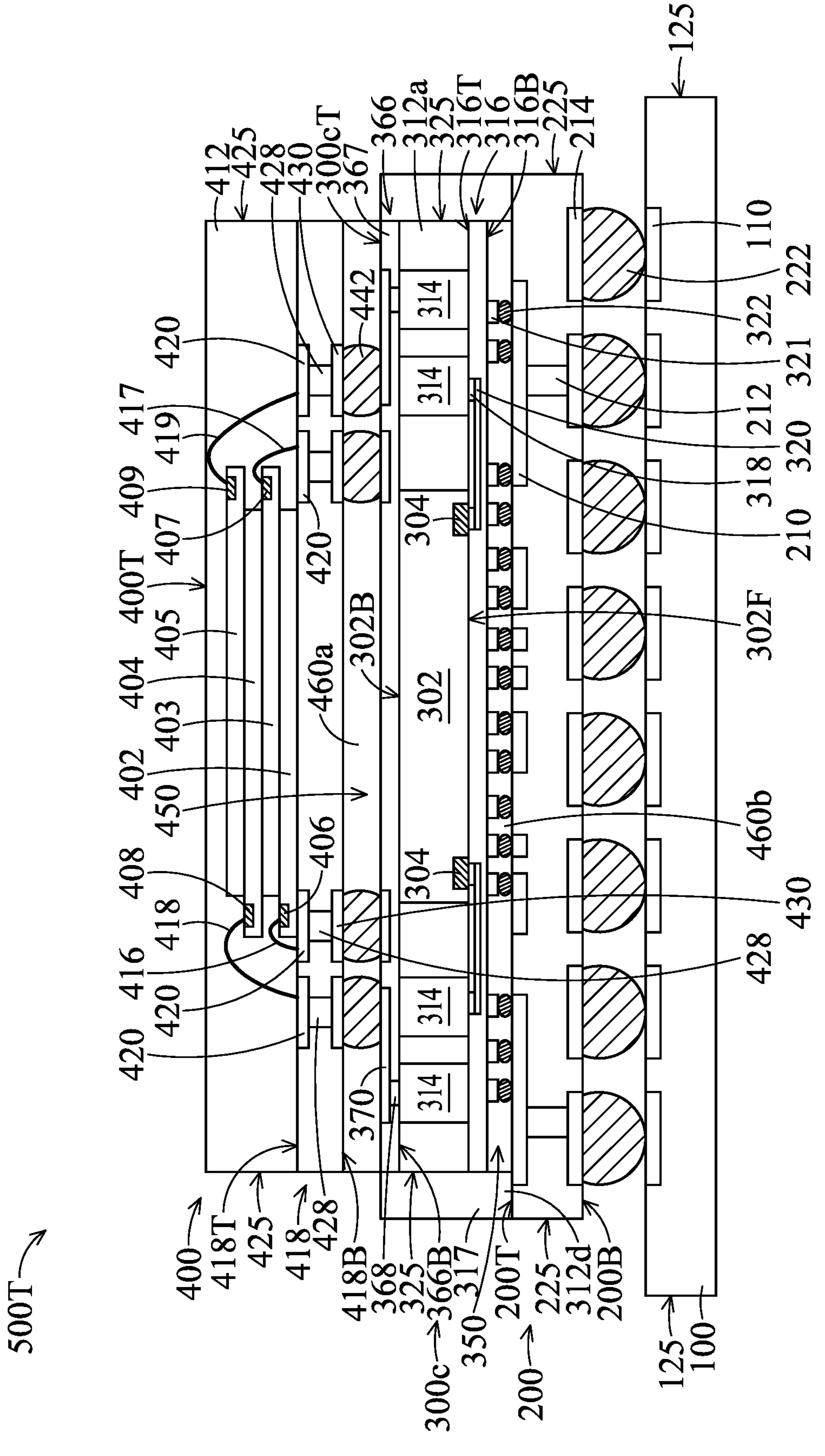

As shown in FIG. 19, the difference between the semiconductor package assembly 500S and the semiconductor package assembly 500T is that the semiconductor package assembly 500T further includes the molding compound 312*d* surrounds the fan-out package 300*c* and the underfill 460*b*.

Figure 20:
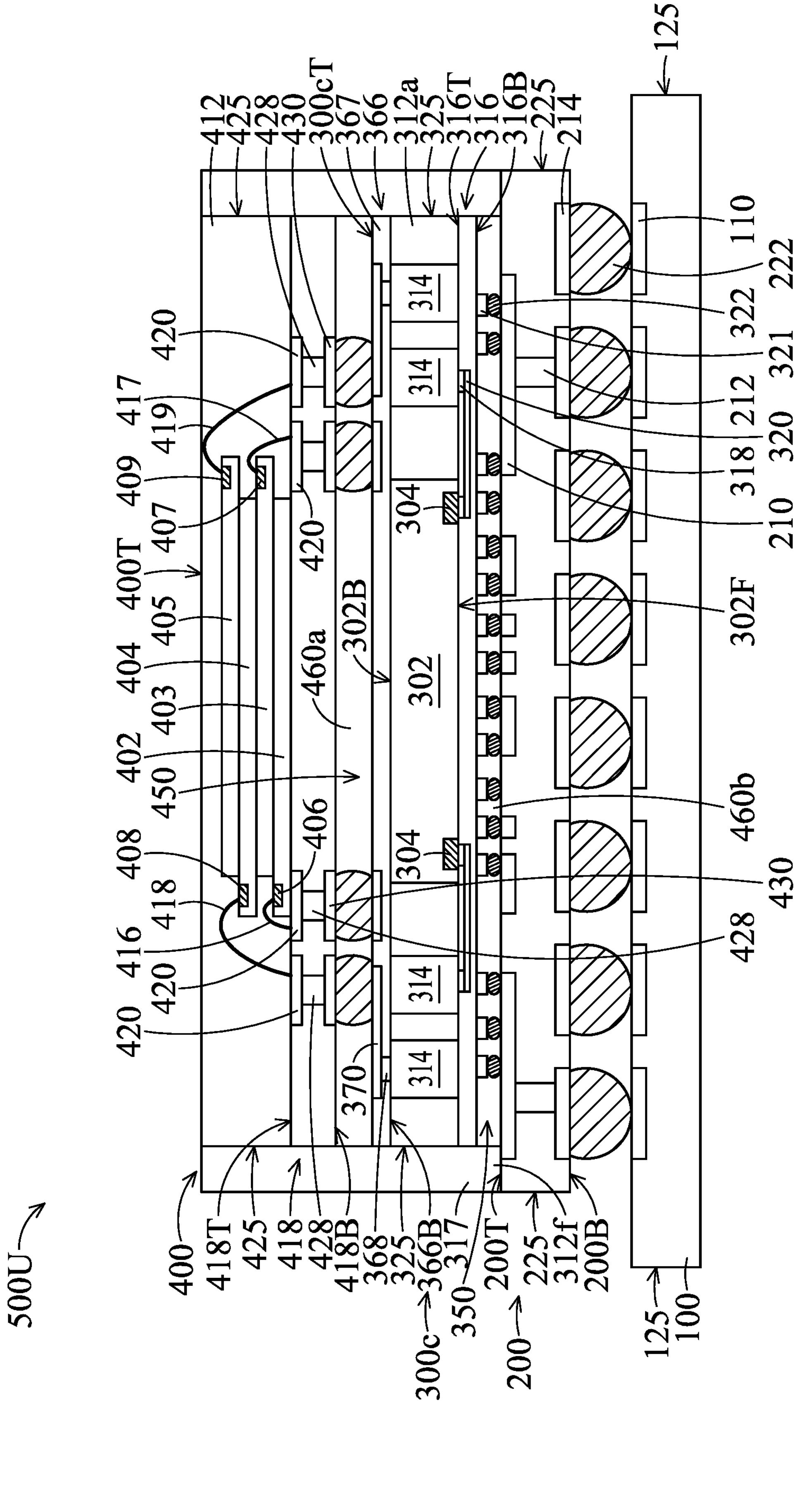

As shown in FIG. 20, the difference between the semiconductor package assembly 500T and the semiconductor package assembly 500U is that the semiconductor package assembly 500U further includes the molding compound 312*f* disposed on the substrate 200 and surrounding the fan-out package 300*c* and the memory package 400. The molding compound 312*f* may further help to reduce the thermal resistance from the fan-out package 300*c* to the memory package 400 and the thermal resistance from the fan-out package 300*c* to the memory package 400.

Figure 21:
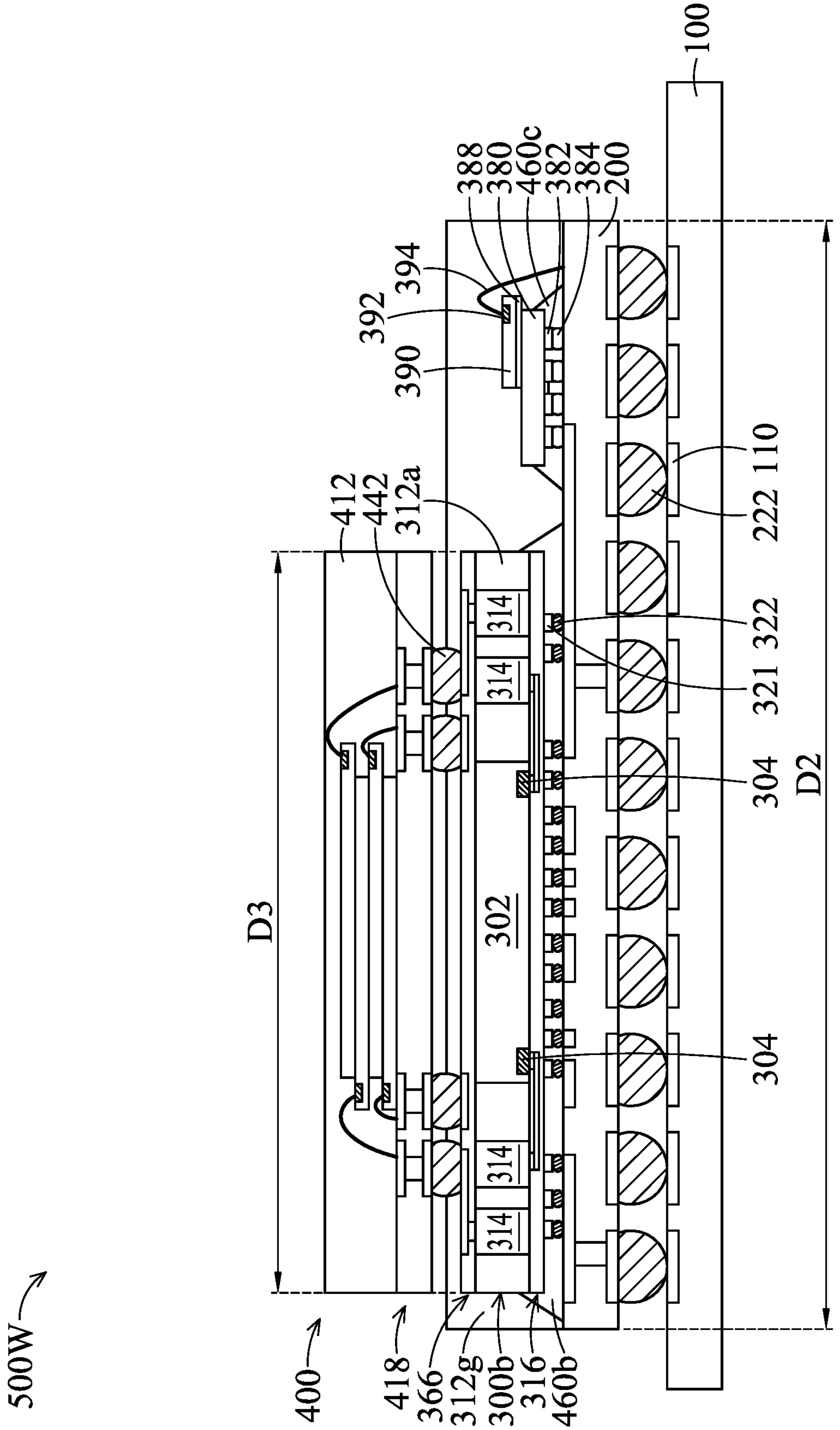
FIG. 21 is a cross-sectional view of a semiconductor package assembly in accordance with some embodiments of the disclosure.

Since the lateral dimension D3 of the fan-out package 300*b* may be less than the lateral dimension D2 of the substrate 200 according to the design requirements. The substrate 200 may provide additional area for electronic components mounted on it. FIG. 21 is a cross-sectional view of a semiconductor package assembly 500W in accordance with some embodiments of the disclosure. Elements of the embodiments hereinafter, that are the same or similar as those previously described with reference to FIGS. 1-20, are not repeated for brevity. As shown in FIG. 21, the difference between the semiconductor package assembly 500Q and the semiconductor package assembly 500W is that the semiconductor package assembly 500W further includes a first electronic component 380 mounted on the top surface 200T of the substrate 200 and beside the fan-out package 300*b*. The first electronic component 380 may be fabricated by a flip-chip technology. Pads 382 of the first electronic component 380 are electrically connected to the substrate 200 using conductive structures 384. In some embodiments, the first electronic component 380 is electrically connected to the fan-out package 300*b* using the substrate 200. In some embodiments, the semiconductor package assembly 500W further includes an underfill 460*c* fills a gap (not shown) between the first electronic component 380 and the substrate 200 and surrounds the conductive structures 384. In some embodiments, the underfill 460*a*, 460*b* and 460*c* may comprise the same or similar materials and fabrication processes.

In some embodiments, the semiconductor package assembly 500W may further include a second electronic component 390 stacked on the first electronic component 380. A pad 392 of the second electronic component 390 may be electrically connected to the substrate 200 using a bonding wire 394. In some embodiments, the second electronic component 390 is electrically connected to the fan-out package 300*b* using the substrate 200. In some embodiments, the first electronic component 380 and the second electronic component 390 comprise integrated passive device (IPD) including a capacitor, an inductor, a resistor, or a combination thereof. In some embodiments, the first electronic component 380 and the second electronic component 390 comprise DRAM dies, modem chips, etc.

As shown in FIG. 21, the semiconductor package assembly 500W further includes a molding compound 312*g* disposed on and in contact with the top surface 200T of the substrate 200. The molding compound 312*g* surrounds the fan-out package 300*b*, the first electronic component 380 and the second electronic component 390. In some embodiments, the molding compound 312*g* may surround the conductive structures 442 of the memory package 400. Side surfaces (not shown) of the molding compound 312*g* may be respectively aligned with side surfaces 225 of the substrate 200. The molding compound 312*g* is formed after disposing the fan-out package 300*b*, the first electronic component 380 and the second electronic component 390 on the substrate 200. In addition, the molding compound 312*g* is formed after forming the underfills 460*b* and 460*c*. In some embodiments, the molding compound 312*a*-312*g* and 412 may comprise the same or similar materials and fabrication processes.

Embodiments provide a semiconductor package assembly. The semiconductor package assembly includes a fan-out package, a memory package stacked on the fan-out package and a substrate provided for the fan-out package stack thereon. The fan-out package includes a logic die with exposed back surface, thereby providing an additional thermal dissipating path to directly dissipate the heat from the logic die to the outside environment. The fan-out package includes a front-side RDL structure formed on the front surface of the logic die and having a thickness that is less than the thickness of the substrate. Compared with the conventional package-on-package (PoP) package assembly with directly connections between the logic die and the thick substrate, the fan-out package uses the thin front-side RDL structure directly connected to the logic die for re-routing. Therefore, the extra low K (ELK) stress can be significantly reduced. The CTE (coefficient of thermal expansion) mismatch problem between the logic die and substrate can be improved. Since the front-side RDL structure has the thinner thickness and the finer routings, the semiconductor package assembly can have improved electrical performances. In addition, the memory package can be electrically connected to the logic die of the fan-out package the front-side RDL structure and without using the substrate. The memory package can be electrically connected to the substrate using the logic die. In some embodiments, the fan-out package includes TV interconnects provided as vertical electrical connections to the memory package. The pitch of the TV interconnects can be further reduced with the fan-out technology development. In some embodiments, the pitch of the TV interconnects can be less than or equal to the pitch of the conductive structures of the memory package. In some embodiments, the fan-out package further includes a back-side RDL structure disposed on the back surface of the logic die to provide flexible routing design for the TV interconnects of the fan-out package and the conductive structures of the memory package in different locations and/or pitches. The conductive structures of the memory package are not required to be disposed directly above the corresponding TV interconnects. Therefore, the fan-out package is fabricated without a thick interposer provided for the electrical connections to the memory package. The height of the semiconductor package assembly can be further thinned down. The thermal resistance from the fan-out package to the memory package can be further reduced. In some embodiments, the lateral dimension of the substrate and the lateral dimension of the fan-out package are both variable and depend on the design requirements. The semiconductor package assembly can achieve the goals of reduced fabrication cost and improved electrical performances. In some embodiments, the additional molding compounds and underfills filling the gaps between the fan-out package and the substrate and between the fan-out package and the memory package and/or surrounding the fan-out package and the memory package. The additional molding compounds and underfills may help to reduce the thermal resistance from the fan-out package to the memory package and the thermal resistance from the fan-out package to the substrate.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:

a fan-out package, comprising:

a first redistribution layer (RDL) structure having a top surface and a bottom surface;

a first logic die having first pads thereon, wherein the first pads are in contact with the top surface of the first RDL structure;

through via (TV) interconnects surrounding the first logic die and electrically connected to the first RDL structure; and first conductive structures in contact with the bottom surface of the first RDL structure;

a memory package stacked on the fan-out package, comprising:

a first substrate having a top surface and a bottom surface;

a memory die mounted on the top surface of the first substrate; and second conductive structures on the bottom surface of the first substrate, wherein the memory die is electrically connected to the first logic die using the second conductive structures, the TV interconnects and the first RDL structure; and a second substrate provided for the fan-out package stack thereon, wherein the second substrate is electrically connected to the first logic die using the first conductive structures, wherein the first logic die has a front surface and a back surface, the first pads are located close to the front surface of the first logic die, and the back surface of the first logic die is away from the first RDL structure, and opposite ends of the TV interconnect are aligned with the front surface and the back surface of the logic die, respectively.

2. The semiconductor package assembly as claimed in claim 1, wherein the memory die is electrically connected to the second substrate using the second conductive structures, the TV interconnects, the first logic die, the first RDL structure and the first conductive structures.

3. The semiconductor package assembly as claimed in claim 1, wherein the second conductive structures are disposed directly above the corresponding TV interconnects, respectively.

4. The semiconductor package assembly as claimed in claim 1, wherein the back surface of the first logic die is exposed from a top surface of the fan-out package.

5. The semiconductor package assembly as claimed in claim 1, wherein the memory die is electrically connected to the first substrate using bonding wires.

6. The semiconductor package assembly as claimed in claim 1, wherein the fan-out package comprises:

a first molding compound surrounding the first logic die, being in contact with the top surface of the first RDL structure, wherein the TV interconnects pass through the first molding compound.

7. The semiconductor package assembly as claimed in claim 1, wherein a first thickness of the first RDL structure is less than a second thickness of the second substrate.

8. The semiconductor package assembly as claimed in claim 1, wherein a first lateral dimension of the fan-out package is less than a second dimension of the second substrate in a cross-sectional view.

9. The semiconductor package assembly as claimed in claim 1, wherein the fan-out package comprises:

a second logic die disposed on the top surface of the first RDL structure and beside the first logic die.

10. The semiconductor package assembly as claimed in claim 9, wherein the second logic die is electrically connected to the first logic die using the first RDL structure.

11. The semiconductor package assembly as claimed in claim 1, wherein the fan-out package comprises:

a second redistribution layer (RDL) structure disposed on the first logic die and the TV interconnects and opposite the first RDL structure, wherein the second RDL structure is electrically connected to the TV interconnects.

12. The semiconductor package assembly as claimed in claim 1, further comprising:

a second molding compound filling a gap between the fan-out package and the second substrate and surrounding the first conductive structures.

13. The semiconductor package assembly as claimed in claim 1, further comprising:

a third molding compound filling a gap between the fan-out package and the memory package and surrounding the second conductive structures.

14. The semiconductor package assembly as claimed in claim 1, further comprising:

a fourth molding compound disposed on the second substrate and surrounding the fan-out package.

15. The semiconductor package assembly as claimed in claim 1, further comprising:

a first underfill filling a gap between the fan-out package and the second substrate and surrounding the first conductive structures.

16. The semiconductor package assembly as claimed in claim 1, further comprising:

a second underfill filling a gap between the fan-out package and the memory package and surrounding the second conductive structures.

17. The semiconductor package assembly as claimed in claim 1, further comprising:

a first electronic component mounted on the second substrate and beside the fan-out package, wherein the first electronic component is electrically connected to the fan-out package using the second substrate.

18. The semiconductor package assembly as claimed in claim 17, further comprising:

a second electronic component stacked on the first electronic component, wherein the second electronic component is electrically connected to the fan-out package using the second substrate.

19. A semiconductor package assembly, comprising:

a fan-out package, comprising:

a first redistribution layer (RDL) structure having a top surface and a bottom surface;

a first logic die having first pads close to the top surface of the first RDL structure and electrically connected to the first RDL structure;

through via (TV) interconnects surrounding the first logic die and electrically connected to the first logic die using the first RDL structure, wherein the TV interconnects are arranged by a first pitch; and first conductive structures on the bottom surface of the first RDL structure;

a memory package stacked on the fan-out package, comprising:

a first substrate having a top surface and a bottom surface;

a memory die mounted on the top surface of the first substrate; and second conductive structures on the bottom surface of the first substrate and arranged by a second pitch shorter than or equal to the first pitch; and a second substrate stacked on the fan-out package and opposite the memory package, wherein the second substrate is electrically connected to the memory package using the first logic die, wherein the first logic die has a front surface and a back surface, the first pads are located close to the front surface of the first logic die, and the back surface of the first logic die is away from the first RDL structure, and opposite ends of the TV interconnect are aligned with the front surface and the back surface of the logic die, respectively.

20. The semiconductor package assembly as claimed in claim 19, wherein the memory die is electrically connected to the first logic die using the second conductive structures, the TV interconnects and the first RDL structure.

21. The semiconductor package assembly as claimed in claim 19, wherein the back surface of the first logic die is exposed from a top surface of the fan-out package.

22. The semiconductor package assembly as claimed in claim 21, wherein the fan-out package comprises:

a first molding compound disposed on the top surface of the first RDL structure and surrounding the first logic die and the TV interconnects, wherein the back surface of the first logic die is exposed from the molding compound.

23. The semiconductor package assembly as claimed in claim 19, wherein the fan-out package comprises:

a second logic die disposed on the top surface of the first RDL structure and between the first logic die and the TV interconnects, wherein the second logic die is electrically connected to the first logic die using the first RDL structure.

24. The semiconductor package assembly as claimed in claim 19, wherein the fan-out package comprises:

a second redistribution layer (RDL) structure between the second conductive structures and the first logic die, wherein the second RDL structure is electrically connected to the TV interconnects.

25. The semiconductor package assembly as claimed in claim 19, further comprising:

a second molding compound filling a gap between the fan-out package and the second substrate and surrounding the first conductive structures.

26. The semiconductor package assembly as claimed in claim 19, further comprising:

a third molding compound filling a gap between the fan-out package and the memory package and surrounding the second conductive structures.

27. The semiconductor package assembly as claimed in claim 19, further comprising:

a fourth molding compound disposed on the second substrate and surrounding the fan-out package.

28. The semiconductor package assembly as claimed in claim 19, further comprising:

a first underfill filling a gap between the fan-out package and the second substrate and surrounding the first conductive structures.

29. The semiconductor package assembly as claimed in claim 19, further comprising:

a second underfill filling a gap between the fan-out package and the memory package and surrounding the second conductive structures.

30. The semiconductor package assembly as claimed in claim 19, further comprising:

a first electronic component mounted on the second substrate and beside the fan-out package, wherein the first electronic component is electrically connected to the fan-out package using the second substrate.

31. The semiconductor package assembly as claimed in claim 30, wherein the fan-out package comprises:

a second redistribution layer (RDL) structure between the second conductive structures and the first logic die, wherein the second RDL structure is electrically connected to the TV interconnects.

32. A semiconductor package assembly, comprising:

a fan-out package, comprising:

a first redistribution layer (RDL) structure having a top surface and a bottom surface;

a first logic die having first pads close to the top surface of the first RDL structure and electrically connected to the first RDL structure;

through via (TV) interconnects surrounding the first logic die and electrically connected to the first logic die using the first RDL structure; and first conductive structures on the bottom surface of the first RDL structure;

a memory package stacked on the fan-out package, comprising:

a first substrate having a top surface and a bottom surface;

a memory die mounted on the top surface of the first substrate; and second conductive structures on the bottom surface of the first substrate, wherein the memory die is electrically connected to the first logic die using the first RDL structure; and a second substrate stacked on the fan-out package and opposite the memory package, wherein the second substrate is electrically connected to the memory package using the fan-out package, wherein a first lateral dimension of the fan-out package is less than or equal to a second dimension of the second substrate in a cross-sectional view, wherein the first logic die has a front surface and a back surface, the first pads are located close to the front surface of the first logic die, and the back surface of the first logic die is away from the first RDL structure, and opposite ends of the TV interconnect are aligned with the front surface and the back surface of the logic die, respectively.

33. The semiconductor package assembly as claimed in claim 32, wherein the memory die is electrically connected to the second substrate using the first logic die and the first RDL structure.

34. The semiconductor package assembly as claimed in claim 32, wherein the back surface of the first logic die is exposed from a top surface of the fan-out package.

35. The semiconductor package assembly as claimed in claim 34, wherein the fan-out package comprises:

a first molding compound in contact with the top surface of the first RDL structure and surrounding the first logic die and the TV interconnects, wherein the back surface of the first logic die is exposed from the molding compound.

36. The semiconductor package assembly as claimed in claim 32, wherein the fan-out package comprises:

a second logic die disposed on the top surface of the first RDL structure and between the first logic die and the TV interconnects, wherein the second logic die is electrically connected to the first logic die using the first RDL structure.

37. The semiconductor package assembly as claimed in claim 32, further comprising:

a second molding compound filling a first gap between the fan-out package and the second substrate or a second gap between the fan-out package and the memory package.

38. The semiconductor package assembly as claimed in claim 32, further comprising:

an underfill filling a first gap between the fan-out package and the second substrate or a second gap between the fan-out package and the memory package.

39. The semiconductor package assembly as claimed in claim 32, further comprising:

a first electronic component mounted on the second substrate and beside the fan-out package, wherein the first electronic component is electrically connected to the fan-out package using the second substrate.

* * * * *